United States Patent
Tsuji et al.

(10) Patent No.: US 8,729,467 B2
(45) Date of Patent: May 20, 2014

(54) CHARGED PARTICLE RADIATION DEVICE

(75) Inventors: Hiroshi Tsuji, Hitachinaka (JP); Ichiro Tachibana, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/500,592

(22) PCT Filed: Oct. 6, 2010

(86) PCT No.: PCT/JP2010/067569
§ 371 (c)(1),
(2), (4) Date: Apr. 5, 2012

(87) PCT Pub. No.: WO2011/043391
PCT Pub. Date: Apr. 14, 2011

(65) Prior Publication Data
US 2012/0193550 A1 Aug. 2, 2012

(30) Foreign Application Priority Data
Oct. 7, 2009 (JP) ................................. 2009-233747

(51) Int. Cl.
*H01J 3/14* (2006.01)

(52) U.S. Cl.
USPC ........... 250/306; 250/307; 250/311; 52/167.8

(58) Field of Classification Search
USPC ........ 250/492.1, 306; 248/560, 598; 52/167.8
See application file for complete search history.

(56) References Cited

U.S. PATENT DOCUMENTS

| | | | | |
|---|---|---|---|---|
| 2,826,281 A | * | 3/1958 | Johnson | ........................... 52/158 |
| 4,278,726 A | * | 7/1981 | Wieme | ....................... 428/300.7 |
| 4,822,834 A | * | 4/1989 | Blevins | .......................... 524/427 |
| 6,223,483 B1 | * | 5/2001 | Tsukagoshi | ................... 52/167.1 |
| 8,250,818 B2 | * | 8/2012 | Tremblay et al. | .............. 52/167.3 |
| 8,302,351 B2 | * | 11/2012 | Ohashi et al. | ................ 52/167.1 |
| 2005/0077664 A1 | * | 4/2005 | Mochimaru et al. | .......... 267/196 |
| 2005/0205809 A1 | | 9/2005 | Uchida | |
| 2006/0277843 A1 | * | 12/2006 | Livingston et al. | .............. 52/110 |
| 2010/0218439 A1 | * | 9/2010 | Ohashi et al. | ................. 52/167.8 |

FOREIGN PATENT DOCUMENTS

| | | |
|---|---|---|
| JP | 1-76031 | 5/1989 |
| JP | 1-87532 | 6/1989 |
| JP | 2000-208387 | 7/2000 |
| JP | 2001-93456 | 4/2001 |
| JP | 2004-234960 | 8/2004 |
| JP | 2005-268268 | 9/2005 |
| JP | 2008-052946 | 3/2008 |
| JP | 2008-052947 | 3/2008 |
| WO | WO 2008149996 A1 * 12/2008 | ................ E04H 9/02 |

OTHER PUBLICATIONS

International Search Report mailed Nov. 16, 2010 in International Application No. PCT/JP2010/067569.

* cited by examiner

*Primary Examiner* — Jack Berman
*Assistant Examiner* — Kevin Chung
(74) *Attorney, Agent, or Firm* — Brundidge & Stanger, P.C.

(57) ABSTRACT

Provided is a charged particle radiation device enabling suppression of both inclination and vertical vibration of a charged particle optical lens barrel, with a simple configuration. A charged particle radiation device according to the present invention includes a vibration damping member (19) including viscoelastic material sheets (16A and 16B) sandwiched by support plates (17A and 17B), and is configured so that a plane including a sheet surface of each viscoelastic material sheet is not perpendicular to a center axis of the charged particle optical lens barrel.

6 Claims, 18 Drawing Sheets

(a)

(b)

Shear strain γ =X/T

CHARGED PARTICLE RADIATION DEVICE

TECHNICAL FIELD

The present invention relates to a charged particle radiation device.

BACKGROUND ART

In charged particle radiation devices such as scanning electron microscopes, ion microscopes, semiconductor test devices, a sample is irradiated with a charged particle radiation beam generated under an ultrahigh vacuum environment inside a charged particle optical lens barrel and secondary electrons emitted or reflected electrons backscattered from the sample are detected to obtain an observed image of the sample. Therefore, if the charged particle optical lens barrel vibrates relative to the sample, the position irradiated with the charged particle radiation beam frequently changes, resulting in the observed image being deformed and/or an edge of a pattern looking vibrating, and if plural observed images are added up, the image resulting from the addition including a blurred edge. As described above, vibration of a charged particle optical lens barrel causes deterioration in image quality of observed images, and furthermore, may become one of the causes of a decrease in resolution of the charged particle radiation device, and thus, it is necessary to make an effort to damp such vibration.

Effects imposed by vibration of a charged particle optical lens barrel on a charged particle radiation device will be described taking a semiconductor test device as an example. Semiconductor test devices are devices that observe defects in patterns in semiconductor devices formed by exposure on a wafer, and classify the defects depending to their types. In recent years, accompanied by miniaturization of semiconductor devices, it is necessary that the sizes of defects to be detected be also reduced. At the same time, it is necessary that the number of defects detected per unit time be increased. Furthermore, it is expected that the most common size of wafers for semiconductor devices will transition from $\phi 300$ mm to $\phi 450$ mm. As described above, it is necessary to achieve a high resolution and a high throughput while the sizes of the devices are increased.

In a semiconductor test device, it is necessary to move a stage with a wafer mounted thereon to an observation position. Here, if a sample chamber is vibrated by a reaction force generated when the stage is halted, resulting in the charged particle optical lens barrel vibrating, the quality of images in the test device is lowered as described above. For further throughput enhancement, it is necessary to promptly damp the natural vibration of the charged particle optical lens barrel immediately after the stage is moved to a certain observation position and halted there.

Patent Literatures 1 to 3 disclose techniques for damping of vibration of charged particle optical lens barrels as described below.

Patent Literature 1 discloses an electron beam lithographic device that provides a vibration damping effect enhanced by provision of a vibration damping material layer on an upper surface of a vacuum chamber or a charged particle optical lens barrel.

Patent Literature 2 discloses an electron beam lithographic device in which an upper portion of a charged particle optical lens barrel and four corners of a sample chamber are connected via stays to provide an enhanced vibration damping effect.

Patent Literature 3 discloses a charged particle radiation device in which an ion pump secured to a charged particle optical lens barrel is supported using a frame (support member for the ion pump) secured on a sample chamber, and a damper using a viscoelastic material is inserted between a case and a yoke of the ion pump to suppress external vibration received by the frame or transmission of vibration from the sample chamber to the charged particle optical lens barrel.

CITATION LIST

Patent Literature

Patent Literature 1: JP Utility Model Publication (Kokai) No. 1-76031 U (1989)
Patent Literature 2: JP Utility Model Publication (Kokai) No. 1-87532 U (1989)
Patent Literature 3: JP Patent Publication (Kokai) No. 2008-52947 A

SUMMARY OF INVENTION

Technical Problem

In the technique described in Patent Literature 1, a vibration damping effect is provided using the vibration damping material layer provided on the upper plate of the vacuum chamber, and thus, it can be presumed that a large vibration damping effect is provided for vibration making the lens barrel vibrate vertically but no effect or only a very small effect is provided for vibration making the lens barrel be inclined relative to the sample chamber.

It can be presumed that the technique described in Patent Literature 2 provides a certain level of effect of suppressing transmission of vibration generated at the lens barrel to the sample chamber or transmission of vibration generated at the sample chamber to the lens barrel. However, basically, the lens barrel is merely supported by props, and thus, no effect of damping the vibration itself is provided, and accordingly, no vibration damping effect is provided. Furthermore, since there is a large difference in cross-sectional area between the lens barrel and the stays, it is difficult to attach elongated stays having sufficient rigidity compared to the rigidity of the charged particle optical lens barrel. In other words, it is difficult to attach stays that do not deform even upon receipt of vibration transmitted, that is, the stays themselves may become a vibration source.

In the technique described in Patent Literature 3, dampers are interposed between the yoke and the case and between the case and magnets included in the ion pump to suppress transmission of external vibration. However, viscoelastic materials are generally cured by heating, and thus, a viscoelastic material is disposed inside the ion pump, causing the problem of difficulty in performing baking in the ion pump. Since baking is processing repeatedly performed during use of the charged particle radiation device, the vibration damping function of the charged particle radiation device deteriorates with the deterioration of the viscoelastic material.

As described above, the known techniques described in the Patent Literatures are limited to focusing on only a part of the characteristics of vibration of a charged particle optical lens barrel and providing vibration damping member(s) as a countermeasure therefor, and the above mentioned problems are considered to occur consequently.

An object of the present invention is to provide a charged particle radiation device including means capable of suppressing both inclination and vertical vibration of a charged particle optical lens barrel, with a simple configuration.

Solution to Problem

The present invention achieves the above object by providing a charged particle radiation device including a charged particle optical lens barrel and vibration damping means for the charged particle optical lens barrel, wherein the vibration damping means includes a viscoelastic sheet and a support that supports the viscoelastic sheet, and wherein the vibration damping means is disposed so that a normal to a cylindrical surface of the charged particle optical lens barrel at a position to which the vibration damping member is attached and a normal to a sheet surface of the viscoelastic sheet are at least not parallel to each other.

Advantageous Effects of Invention

In the support member having a vibration damping function or the charged particle radiation device according to the present invention, in both cases where the charged particle optical lens barrel is inclined and where the charged particle optical lens barrel vibrates vertically, shear strain is generated in the viscoelastic material sheet, enabling suppression of the inclination and the vertical vibration. Also, the support member having a vibration damping function according to the present invention has a simple configuration in which the viscoelastic material sheet is sandwiched by support plates, enabling simplification of the configuration for vibration damping.

DESCRIPTION OF EMBODIMENTS

Figure 1:
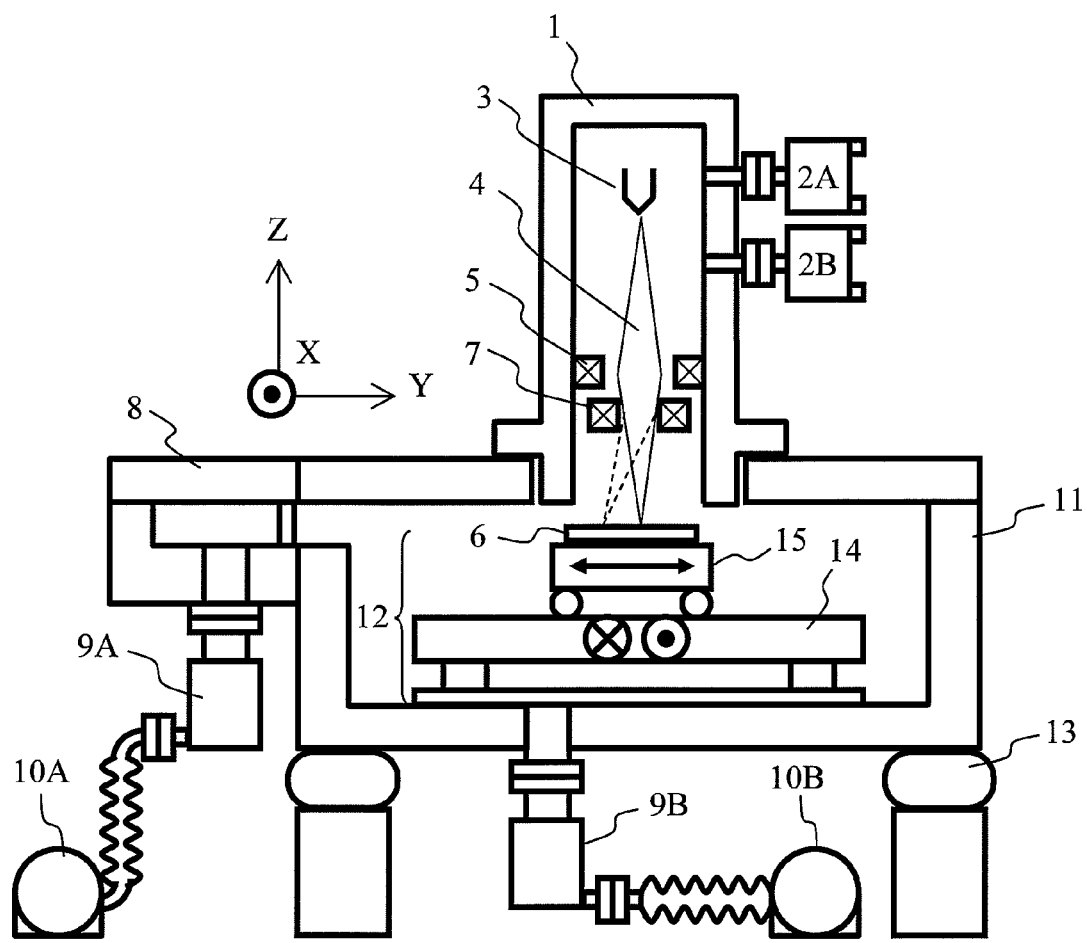
FIG. 1 is a sectional side elevation illustrating an overall configuration of a charged particle radiation device 100 according to embodiment 1.

First, basic ideas of the present invention will be described.

Where a vibration damping member is configured using a viscoelastic sheet, in order to provide the effect of suppressing both inclination and vertical vibration, it is only necessary that shear strain be generated in the viscoelastic material sheet in both cases in which the charged particle optical lens barrel is inclined and the charged particle optical lens barrel vibrates vertically. The present inventors have conceived of the idea that such situation can be achieved by disposing the viscoelastic sheet so that a surface of the viscoelastic sheet where shear strain has been generated does not face a cylindrical surface of the charged particle optical lens barrel, in other words, disposing the vibration damping member so that a normal to the cylindrical surface of the charged particle optical lens barrel at a position to which the vibration damping member is attached and a normal to a sheet surface of the viscoelastic sheet are at least not parallel (preferably are perpendicular) to each other.

Meanwhile, there has conventionally been common knowledge that in a charged particle radiation device, a vibration damping member is provided at a joint part between components included in the charged particle radiation device such as a joint part between a charged particle optical lens barrel and a sample chamber or joint parts between a sample chamber and mounts. For example, in Patent Literature 3, damper(s) are disposed between a yoke and a case or between a case and magnets included in an ion pump. However, where a vibration damping member is disposed at a joint part between components, disposition of the viscoelastic sheet is restricted by the shape and/or direction of the joint surface, and thus, it is difficult to dispose a viscoelastic sheet in such a manner as described above.

Therefore, the present invention enables disposition of a vibration damping member in the aforementioned manner by providing a vibration damping function using a viscoelastic sheet to a support member itself, which supports a charged particle optical lens barrel, and securing the support member to the charged particle optical lens barrel as a vibration damping member.

Examples of disposition of a vibration damping member so that a normal to a sheet surface of a viscoelastic sheet and a normal to a cylindrical surface of a charged particle optical lens barrel at a position to which a vibration damping member is attached include the following manners.

(1) A viscoelastic material sheet adhered or fixed to a support member is disposed so that a plane including a sheet surface thereof is not perpendicular to a center axis of a charged particle optical lens barrel.

(2) A viscoelastic material sheet adhered or fixed to a support member is disposed so that a sheet surface thereof is parallel to a center axis of a charged particle optical lens barrel.

For a specific example of the disposition manner (1) above, the support member may be disposed so that the support member is inclined relative to the center axis of the charged particle optical lens barrel. Also, for a specific example of the disposition manner (2) above, a support member including a viscoelastic sheet of, for example, a rectangular shape may be disposed in a direction of a radial vector of a side surface of the charged particle optical lens barrel.

The abovementioned disposition manners are mere modes of the present invention, and it should be understood that any configuration in which a vibration damping member is disposed so that a normal to a sheet surface of a viscoelastic sheet and a normal to a cylindrical surface of a charged particle optical lens barrel are not parallel to each other falls within the technical idea of the present invention.

Embodiment 1

In the present embodiment, an embodiment of a charged particle radiation device in which support members having a vibration damping function are disposed so that the support members are inclined relative to a charged particle optical lens barrel, and an end of each of the support members is secured to the charged particle optical lens barrel, and another end of each of the support members is secured to an upper surface of a sample chamber will be described.

FIG. 1 is a sectional side elevation illustrating an overall configuration of a charged particle radiation device 100 according to embodiment 1 of the present invention.

The inside of the charged particle optical lens barrel 1 is maintained in an ultrahigh vacuum state by ion pumps 2. The charged particle optical lens barrel 1 includes a charged particle optical system in which a charged particle radiation beam 4 emitted from a charged particle radiation source 3 is made to converge on a sample 6 by an objective lens 5 and slightly deflected by a deflector 7.

The sample 6 is inserted from a load lock chamber 8. The load lock chamber 8 is evacuated by a turbomolecular pump 9A and a dry pump 10A and enters a vacuum state. Subsequently, the sample 6 is mounted on a stage 12 inside a sample chamber 11. The inside of the sample chamber 11 is constantly maintained in a vacuum state by the turbomolecular pump 9B and the dry pump 10B.

The sample chamber 11 is supported by vibration-free mounts 13 and thereby insulated from floor vibration.

Figure 2:
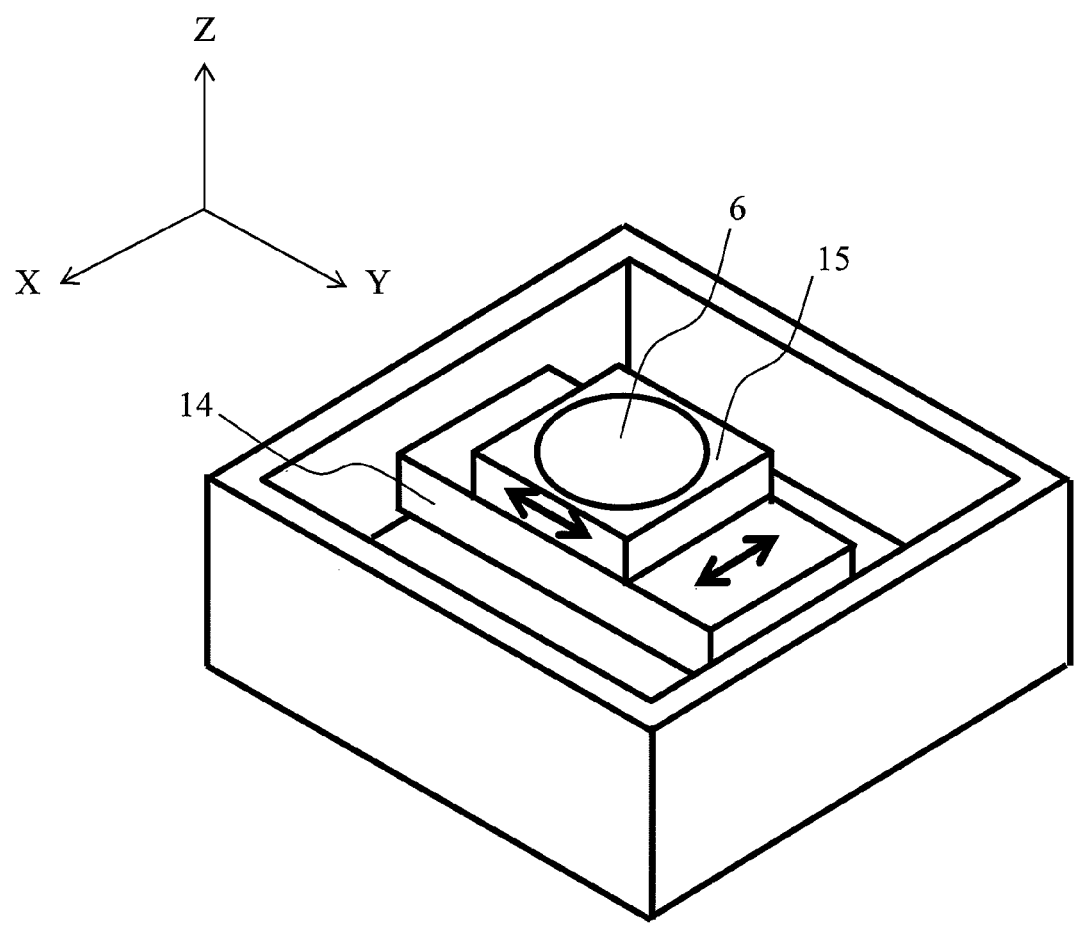
FIG. 2 is a perspective diagram illustrating a configuration of a stage 12.

FIG. 2 is a perspective diagram illustrating a configuration of the stage 12. An X table 14 and a Y table 15 are moved relative to the sample chamber 11, enabling two-dimensional movement of the sample 6.

Figure 3:
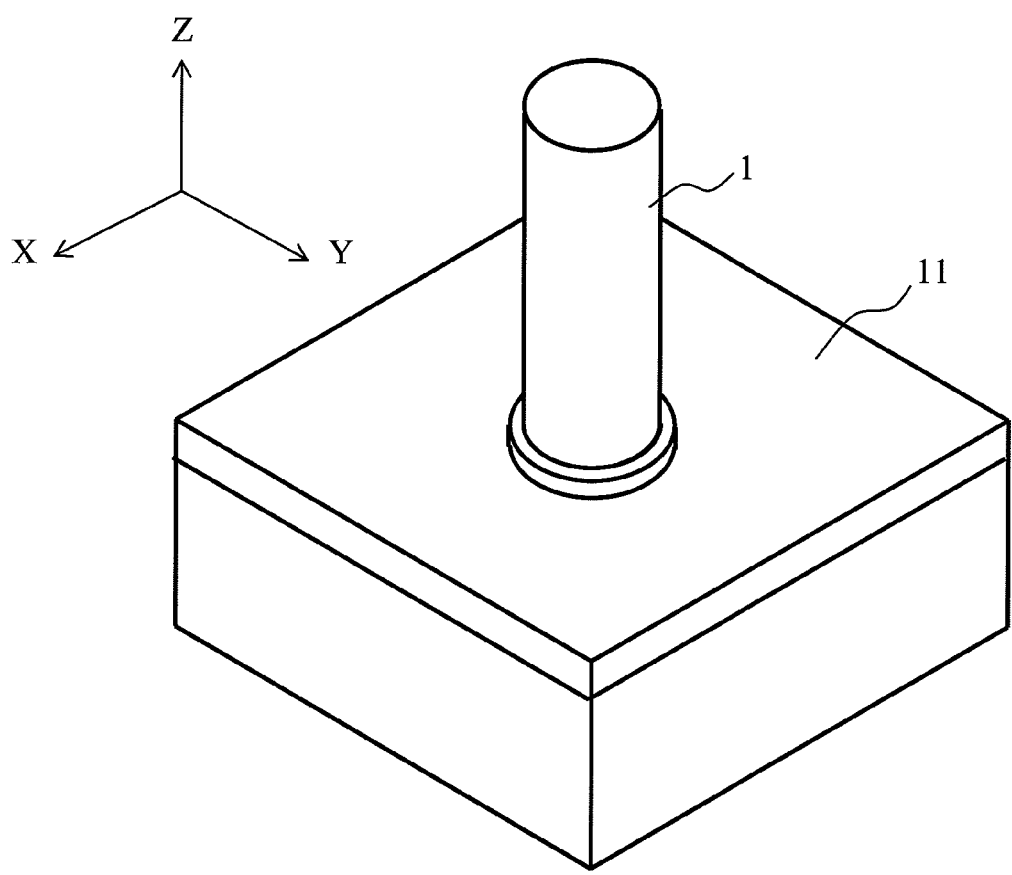
FIG. 3 is a perspective diagram illustrating connection between a charged particle optical lens barrel 1 and a sample chamber 11.

FIG. 3 is a perspective diagram illustrating connection between the charged particle optical lens barrel 1 and the sample chamber 11. Here, the peripheral members are omitted. In the configuration illustrated in FIG. 3, the charged particle optical lens barrel 1 is secured to the sample chamber 11 at a lower end thereof merely by fastening a flange to the sample chamber 11 via bolts. Accordingly, upon a reaction force to driving of the stage 12 being imposed on the sample chamber 11, the charged particle optical lens barrel 1 vibrates.

Figure 4:
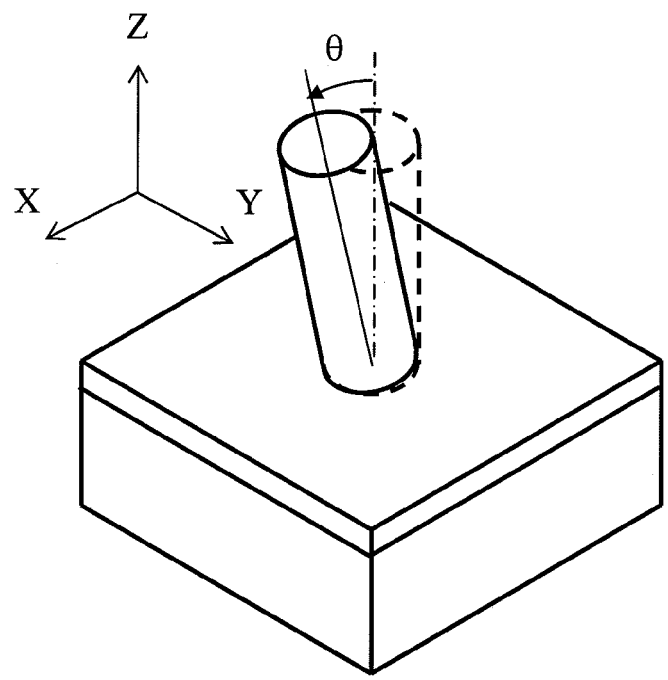
FIG. 4 includes diagrams each illustrating a natural vibration mode of the charged particle optical lens barrel 1.
Figure 4:
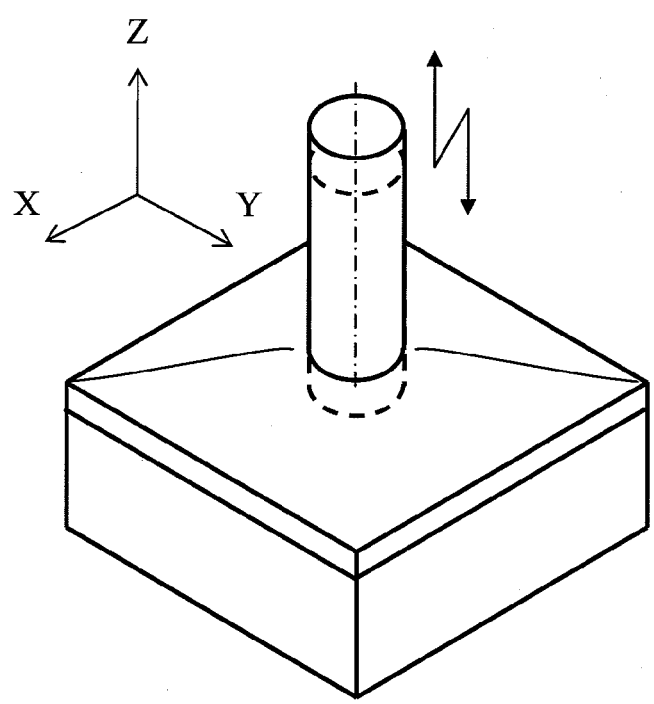

FIG. 4 includes diagrams each illustrating a natural vibration mode of the charged particle optical lens barrel 1. Upon a reaction force to driving of the stage 12 being imposed on the sample chamber 11, as illustrated in FIGS. 4(a) and 4(b), a natural vibration mode of the charged particle optical lens barrel 1 occurs.

As a result of the charged particle optical lens barrel 1 being inclined, an irradiated position is displaced. Furthermore, defocusing occurs due to vertical vibration of the charged particle optical lens barrel 1, and furthermore, displacement of the irradiated position occurs due to the defocusing. Therefore, it is desirable that the displacement of the irradiated position immediately after halting the stage 12 be suppressed in a shortest possible period of time (for example, 0.1 seconds). In the case of a semiconductor test device, it is necessary to reduce the displacement of the irradiated position to not more than a size of a minute defect (for example, not more than 10 nm) in a shortest possible period of time.

Figure 5:
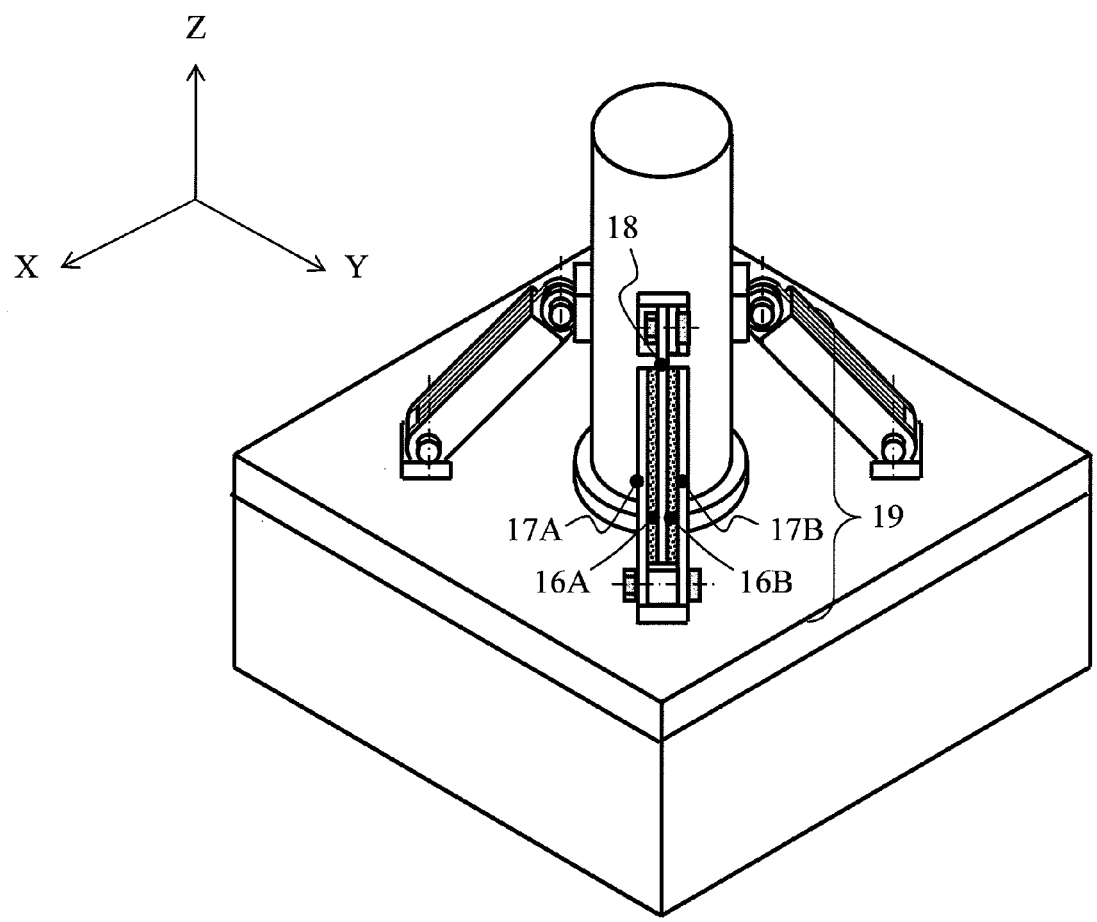
FIG. 5 is a perspective diagram illustrating a configuration in which vibration damping members 19 are disposed around the charged particle optical lens barrel 1.

FIG. 5 is a perspective diagram illustrating a configuration in which support members 19 having a vibration damping function according to the present embodiment (hereinafter, abbreviated as "vibration damping members 19") are disposed around the charged particle optical lens barrel 1. Each vibration damping member 19 has a planar configuration in which viscoelastic material sheets 16A and 16B are sandwiched by stationary-side metal support plate 17A and 17B and a movable-side support plate 18.

The movable-side metal support plate 18 is secured to a side surface of the charged particle optical lens barrel 1. Opposite side surfaces of the movable-side metal support plate 18 are sandwiched by the viscoelastic material sheets 16A and 16B. The viscoelastic material sheet 16A is sandwiched by the stationary-side metal support plate 17A and the movable-side metal support plate 18, and the viscoelastic material sheet 16B is sandwiched by the stationary-side metal support plate 17B and the movable-side metal support plate 18. One end of each of the stationary-side metal support plates 17A and 17B is secured to an upper surface of the sample chamber 11. The stationary-side metal support plates 17A and 17B and the movable-side metal support plate 18 also serve to support the viscoelastic sheets and also support the charged particle optical lens barrel 1 against the sample chamber.

Viscoelastic material sheets 16A and 16B are attached to each of four positions on the sample chamber 11 so as to achieve an angular disposition in which sheet surfaces thereof are vertical to the sample chamber 11 and the sheet surfaces are parallel to a center axis of the charged particle optical lens barrel 1. Since the charged particle optical lens barrel 1 is vertically secured to the upper surface of the sample chamber 11, the aforementioned disposition is intended to damp vertical vibration of the charged particle optical lens barrel 1. This will be described later again with reference to FIG. 6.

Figure 6A:
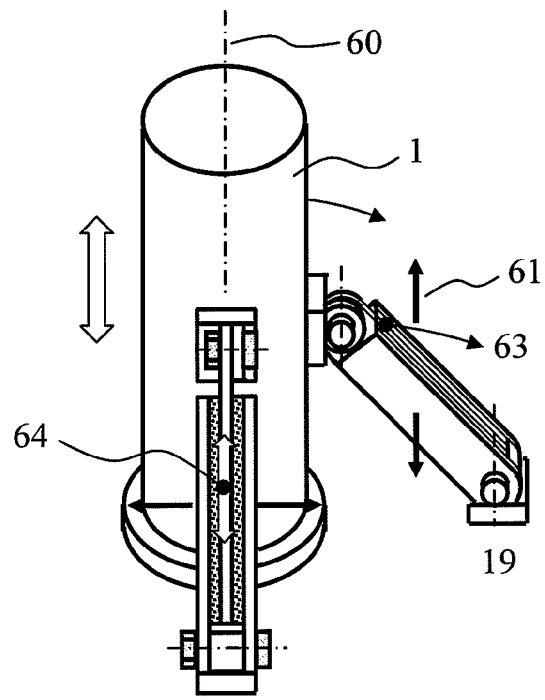
FIG. 6A is a diagram illustrating a manner in which vibration damping members 19 suppress both inclination and vertical vibration of the charged particle optical lens barrel 1.
Figure 6B:
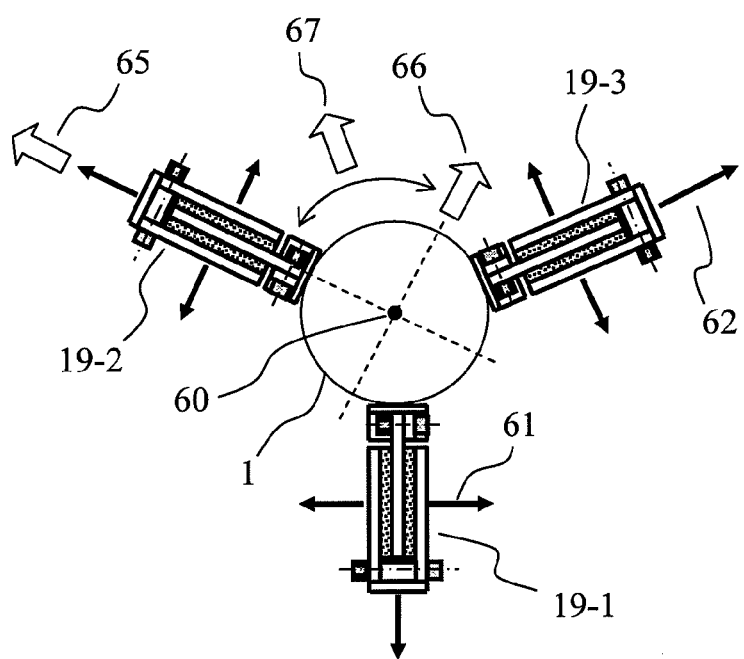
FIG. 6B is a diagram illustrating a manner in which vibration damping members 19 suppress both inclination and vertical vibration of the charged particle optical lens barrel 1.

FIG. 6A is a diagram illustrating a manner that the vibration damping members 19 suppress both inclination and vertical vibration of the charged particle optical lens barrel 1. Also, FIG. 6B is a top view of the charged particle optical lens barrel 1. Three vibration damping members 19-1, 19-2 and 19-3 are attached to respective positions forming a three-fold rotational symmetry in a cylindrical surface of the charged particle optical lens barrel 1. The dashed-dotted line in the Figure indicates a center axis 60 of the charged particle optical lens barrel 1. Also, arrows 61 in the Figure indicate a normal to sheet surfaces of the viscoelastic sheets 16 included in a vibration damping member 19, and arrows 62 each indicate a normal to the cylindrical surface of the charged particle optical lens barrel 1 viewed from a position to which the respective vibration damping member 19 is attached. In the aforementioned Figures, the peripheral members are omitted for ease of illustration.

Upon the charged particle optical lens barrel 1 being inclined rightward in FIG. 6A, the movable-side metal support plate 18 is also inclined together with the charged particle optical lens barrel 1 in the direction indicated by an arrow 63 in the Figure. The stationary-side metal support plates 17A and 17B are still secured to the sample chamber 11, and thus, the viscoelastic material sheets 16A and 16B on the opposite side surfaces of the movable-side metal support plate 18 are pulled by the movable-side metal support plate 18, causing shear strain, which is directed to the right in FIG. 6A, in the viscoelastic material sheets 16A and 16B. As a counteraction therefor, an action of suppressing the inclination of the charged particle optical lens barrel 1 occurs.

Upon the charged particle optical lens barrel 1 vibrating vertically in FIG. 6A, the movable-side metal support plate 18 vibrates vertically in FIG. 6A (in the direction indicated by a white arrow 64 in the Figure) together with the charged particle optical lens barrel 1. Since the stationary-side metal support plates 17A and 17B are also still secured to the sample chamber 11, the viscoelastic material sheets 16A and 16B on the opposite side surfaces of the movable-side metal support plate 18 are pulled by the movable-side metal support plate 18, causing vertical shear strain in FIG. 6A in the viscoelastic material sheets 16A and 16B. Consequently, an action of damping vertical vibration occurs on the charged particle optical lens barrel 1.

Since the share strain is generated in the sheet surfaces of the viscoelastic sheets, in order to provide an effective vibration damping effect for inclination of the charged particle optical lens barrel 1, it is required that an inclined plane of the charged particle optical lens barrel 1 and the sheet surfaces of the viscoelastic sheet be in a positional relationship that they are parallel to each other (preferably in a same plane) or at least not perpendicular to each other. Also, in order to provide an effective vibration damping effect for vertical movement of the charged particle optical lens barrel 1, it is required that the direction of the vertical movement (substantially equal to the center axis of the charged particle optical lens barrel 1) and the sheet surfaces of the viscoelastic sheets be parallel to each other.

The aforementioned two requirements are met when the direction of the inclination of the charged particle optical lens barrel 1 (the direction of the inclined plane viewed from the cylindrical surface of the charged particle optical lens barrel) and the direction of the disposition of the viscoelastic sheets relative to the cylindrical surface of the charged particle optical lens barrel 1 are the same or not perpendicular to each other (do not form an inner product of zero).

For example, in the case of the vibration damping member 19-2 in FIG. 6B, a maximum vibration damping effect can be provided where the direction of the inclination of the charged particle optical lens barrel 1 is the direction indicated by a white arrow 65. In this case, the direction of the inclination is parallel to a normal to the cylindrical surface at a position to which the vibration damping member 19 is attached (that is, the direction in which the viscoelastic sheet is disposed).

Conversely, where the direction of the inclination is the direction indicated by a white arrow 66, the normal to the cylindrical surface at the position to which the vibration damping member 19 is attached is perpendicular to the direction of the inclination, and no effect of suppressing the inclination is provided. This is clear from the point that upon occurrence of inclination in the direction of the normal of the viscoelastic sheets, the plane in which shear strain is generated does not exist in the sheet surfaces.

Where the direction of the inclination lies between the white arrows 65 and 66 (where the direction of the inclination is the direction indicated by a white arrow 67), shear strain according to components parallel to the viscoelastic sheets, of shear strain generated as a result of the inclination, is generated in the viscoelastic sheets, and a certain level of vibration damping effect is generated as a counteraction therefor.

As illustrated in FIG. 6B, where the direction to which each viscoelastic sheet is disposed is a direction of a normal to the cylindrical surface of the charged particle optical lens barrel, the center axis 60 of the charged particle optical lens barrel (or the longitudinal direction of the charged particle optical lens barrel) is constantly parallel to the sheet surface of the viscoelastic sheet. Accordingly, each viscoelastic sheet is disposed in a direction of a radius vector of a cross section of the charged particle optical lens barrel, providing a damping effect for vertical vibration.

Considering the above-described positional relationship with reference to the normal to the sheet surface of each viscoelastic sheet, the above-described positional relationship means the same as such a positional relationship that the normal to the sheet surface of the viscoelastic sheet and the normal to the cylindrical surface of the charged particle optical lens barrel at the attached position are perpendicular to each other or not parallel to each other. In other words, a sheet surface of a viscoelastic sheet is disposed so as to achieve the aforementioned positional relationship with the charged particle optical lens barrel, enabling suppression of both inclination and vertical vibration of the charged particle optical lens barrel 1.

Where the normal to the sheet surface of each viscoelastic material sheet 16 is parallel to the center axis of the charged particle optical lens barrel 1, that is, where a plane including the sheet surface is perpendicular to the center axis of the charged particle optical lens barrel 1, no substantial shear strain is generated in the viscoelastic material sheet 16 even if the charged particle optical lens barrel 1 vibrates vertically, and thus, no sufficient vertical vibration damping effect is exerted. Therefore, in embodiment 1, the viscoelastic material sheets 16 are disposed as described above to suppress both inclination and vertical vibration.

A mechanism of the vibration damping member 19 suppressing inclination and vertical vibration of the charged particle optical lens barrel 1 in embodiment 1 has been described above.

Figure 6C:
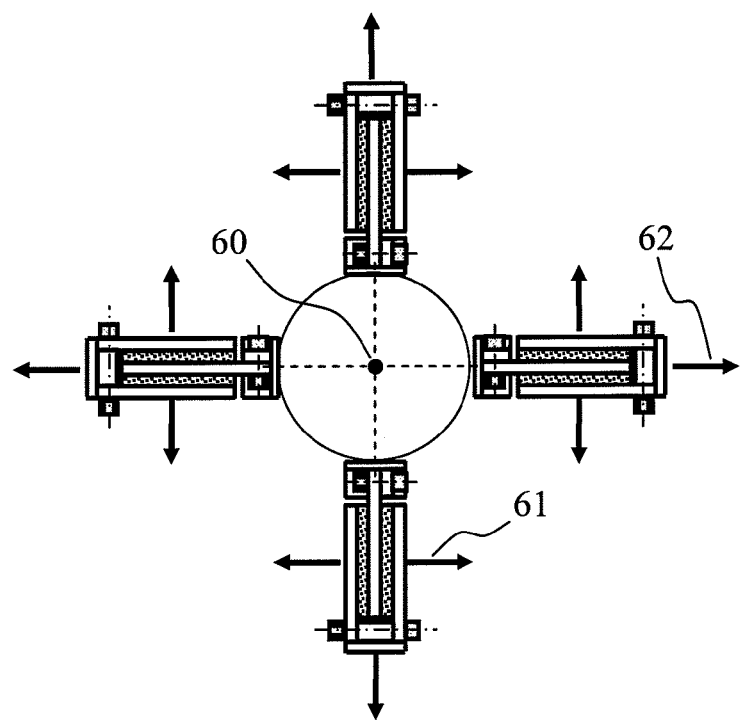
FIG. 6C is a diagram illustrating a manner in which vibration damping members 19 suppress both inclination and vertical vibration of the charged particle optical lens barrel.
Figure 6D:
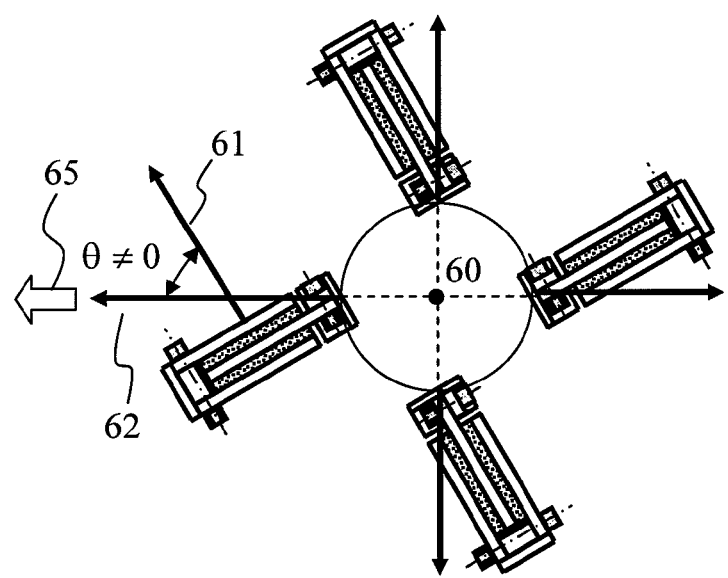
FIG. 6D is a diagram illustrating a manner in which vibration damping members 19 suppress both inclination and vertical vibration of the charged particle optical lens barrel.

FIGS. 6C and 6D each illustrate a variation of a disposition manner of vibration damping members 19. In FIG. 6C, four vibration damping members are attached to positions forming a four-fold rotational symmetry in a cross-section of the charged particle optical lens barrel. This disposition also meets the relationship that a normal 61 to a sheet surface of each viscoelastic sheet and a direction of a normal 62 to a cylindrical surface of a charged particle optical lens barrel at a position to which the vibration damping member is attached are perpendicular to each other. Also, the vibration damping members 19 each include viscoelastic material sheets 16 sandwiched by support plates (17A, 17B and 18), and meets a relationship that a sheet surface of each viscoelastic material sheet 16 is disposed in a direction parallel to a center axis of the charged particle optical lens barrel 1 (a plane including the sheet surface is not perpendicular to the center axis). Consequently, shear strain is generated in the viscoelastic material sheets 16 in both cases where the charged particle optical lens barrel 1 is inclined and where the charged particle optical lens barrel 1 vibrates vertically, enabling exertion of an action of suppressing such inclination and/or the vibration.

FIG. 6D illustrates a variation in which vibration damping members 19 are disposed at an angle relative to respective positions of the charged particle optical lens barrel to which vibration damping members 19 are attached. In the disposition manner of the vibration damping members illustrated in FIG. 6D, a normal 61 to a sheet surface of teach viscoelastic sheet and direction of a normal 62 to a cylindrical surface of a charged particle optical lens barrel at a position to which the relevant vibration damping member is attached are not perpendicular to each other. However, the normals are not completely parallel to each other, and thus, for example, if the charged particle optical lens barrel is inclined in the direction indicated by a white arrow 65, a certain amount of shear strain is generated in the viscoelastic sheet. Accordingly, a certain level of inclination suppression effect can be provided although such effect is small compared to those of the disposition manners illustrated in FIGS. 6B and 6C. The same applies to the below-described embodiments.

Although the above description has been provided in terms of an example in which three or four vibration damping members 19 are disposed around a charged particle optical lens barrel 1, an arbitrary number of vibration damping members 19 may be provided as long as the number is no less than one. However, since the vibration damping performance is different depending on the disposed positions, and the number of, vibration damping members 19, it is preferable that an optimum number and disposition be arbitrarily determined according to the disposition space and the required vibration damping performance.

Embodiment 2

Figure 7:
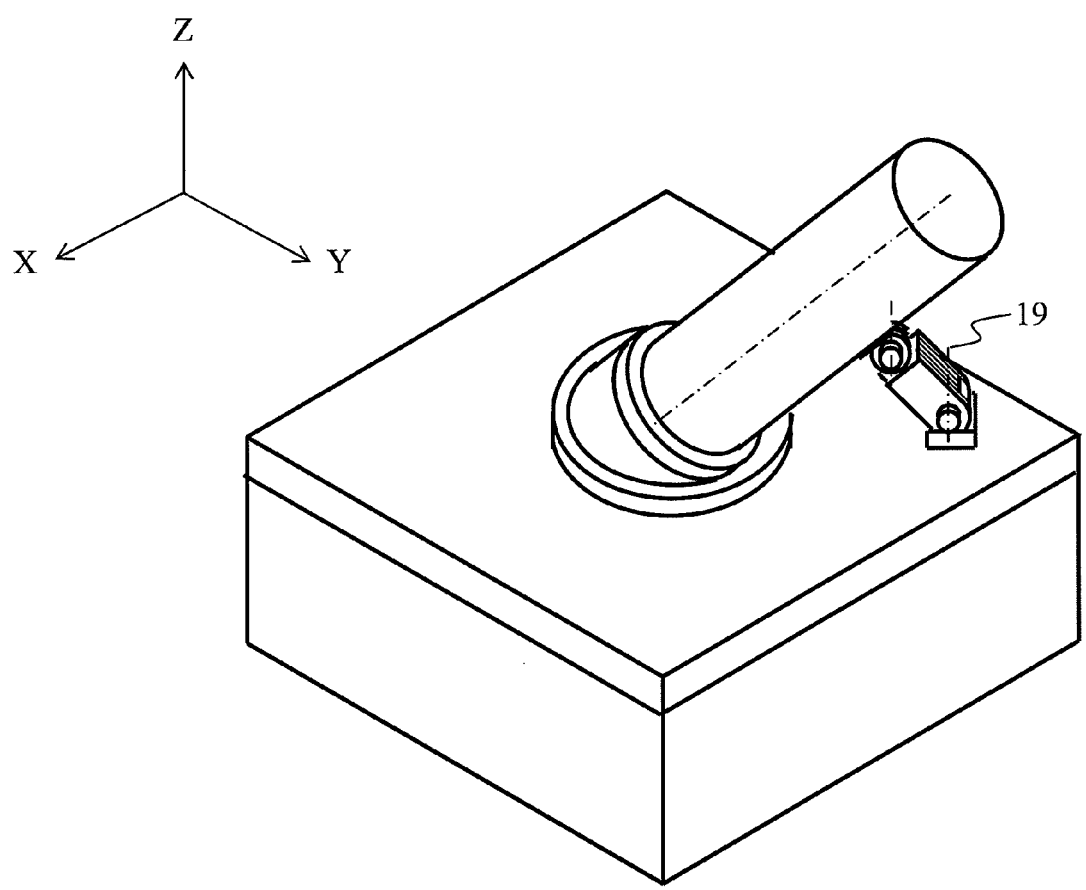
FIG. 7 is a diagram of a configuration around a charged particle optical lens barrel 1 of a charged particle radiation device 100 according to embodiment 2.

FIG. 7 is a diagram of a configuration around a charged particle optical lens barrel 1 of a charged particle radiation device 100 according to embodiment 2.

As opposed to embodiment 1 described with reference to FIGS. 5 and 6, in embodiment 2, a charged particle optical lens barrel 1 is attached at an angle to a sample chamber 11. Also, only one support member 19 having a vibration damping function (hereinafter abbreviated as "vibration damping member 19") is disposed in a direction in which the charged particle optical lens barrel 1 is inclined. Embodiments 1 and 2 are in common to each other in terms of a point that a sheet surface of each viscoelastic material sheet 16 is disposed so that the sheet surface is parallel to a center axis of the charged particle optical lens barrel 1 (a plane including the sheet surface is not perpendicular to the center axis). The rest of the configuration is similar to that of embodiment 1.

Since only one vibration damping member 19 is provided, the vibration damping performance is lowered by that amount of decrease; however, the vibration damping performance can be enhanced by increasing the number of viscoelastic material sheets 16.

Embodiment 3

In the present embodiment, a charged particle radiation device having a configuration in which rectangular support members are disposed lateral to a charged particle optical lens barrel will be described.

Figure 8:
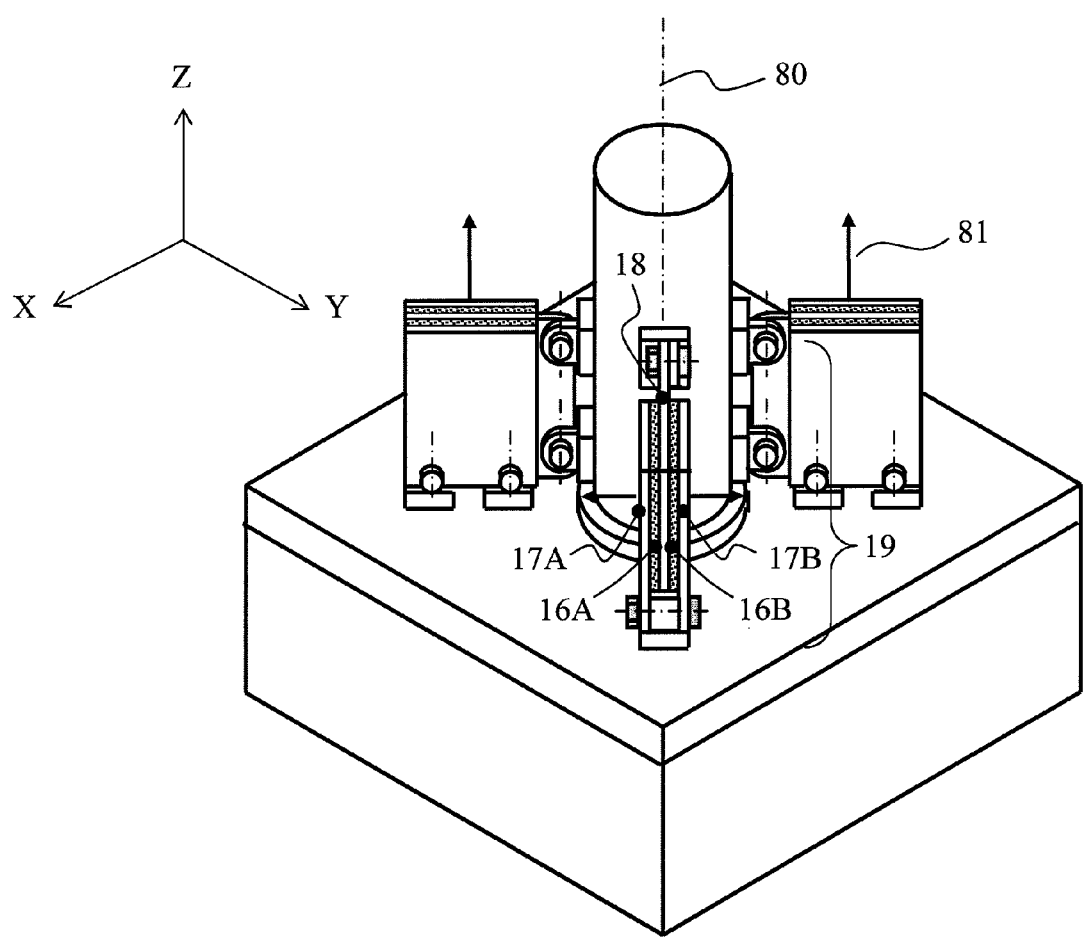
FIG. 8 is a diagram of a configuration around a charged particle optical lens barrel 1 of a charged particle radiation device 100 according to embodiment 3.

FIG. 8 is a diagram of a configuration around a charged particle optical lens barrel 1 of a charged particle radiation device 100 according to embodiment 3. Each vibration damping member in the present embodiment has a rectangular shape, and includes rectangular viscoelastic sheets sandwiched by plate members having a substantially rectangular shape. Each vibration damping member 19 having a rectangular shape is disposed on a side surface of the charged particle optical lens barrel in such a manner that longitudinal sides of the rectangular shape are parallel to a longitudinal direction of the charged particle optical lens barrel. Another side of the rectangular shape (side perpendicular to the longitudinal direction) is secured to an upper surface of the sample chamber. Viewing such disposition from an upper surface of the charged particle optical lens barrel, the vibration damping members 19 are disposed so as to extend in a direction of a radius vector of a cylindrical section of the charged particle optical lens barrel.

While in embodiment 1 described with reference to FIGS. 5 and 6, the support members 19 having a vibration damping function (hereinafter abbreviated as "vibration damping members 19") are disposed in such a manner that they are inclined and lean against the charged particle optical lens barrel 1, the present embodiment is different from embodiment 1 in that the vibration damping members 19 are disposed in such a manner that they stand lateral to the charged particle optical lens barrel 1 and upright relative to the upper surface of the sample chamber 11. However, the present embodiment is in common to embodiments 1 and 2 in terms of the configuration in which each vibration damping member is disposed so that a normal to a sheet surface of each viscoelastic sheet and a normal to a cylindrical surface of a charged particle optical lens barrel are perpendicular to each other, and also in that a sheet surface of each viscoelastic material sheet 16 is disposed in a direction parallel to a center axis of the charged particle optical lens barrel 1 (so that a plane including the sheet surface is not perpendicular to the center axis). The rest of configuration is similar to that of any one of embodiments 1 and 2.

In a vibration damping member 19 having the configuration illustrated in FIG. 8, also, shear strain is generated in viscoelastic material sheets for both inclination and vertical vibration of the charged particle optical lens barrel, and thus, effects similar to those of embodiments 1 and 2 can be exerted. However, the configuration in FIG. 8 requires extra members for securing stationary-side metal support plates 17A and 17B and a movable-side support plate 18 to the charged particle optical lens barrel 1 and the upper surface of the sample chamber 11, respectively. However, the adhesion area of each viscoelastic material sheet 16 is large compared to those of embodiments 1 and 2, and thus, the vibration damping performance is enhanced by that amount.

Embodiment 4

Figure 9:
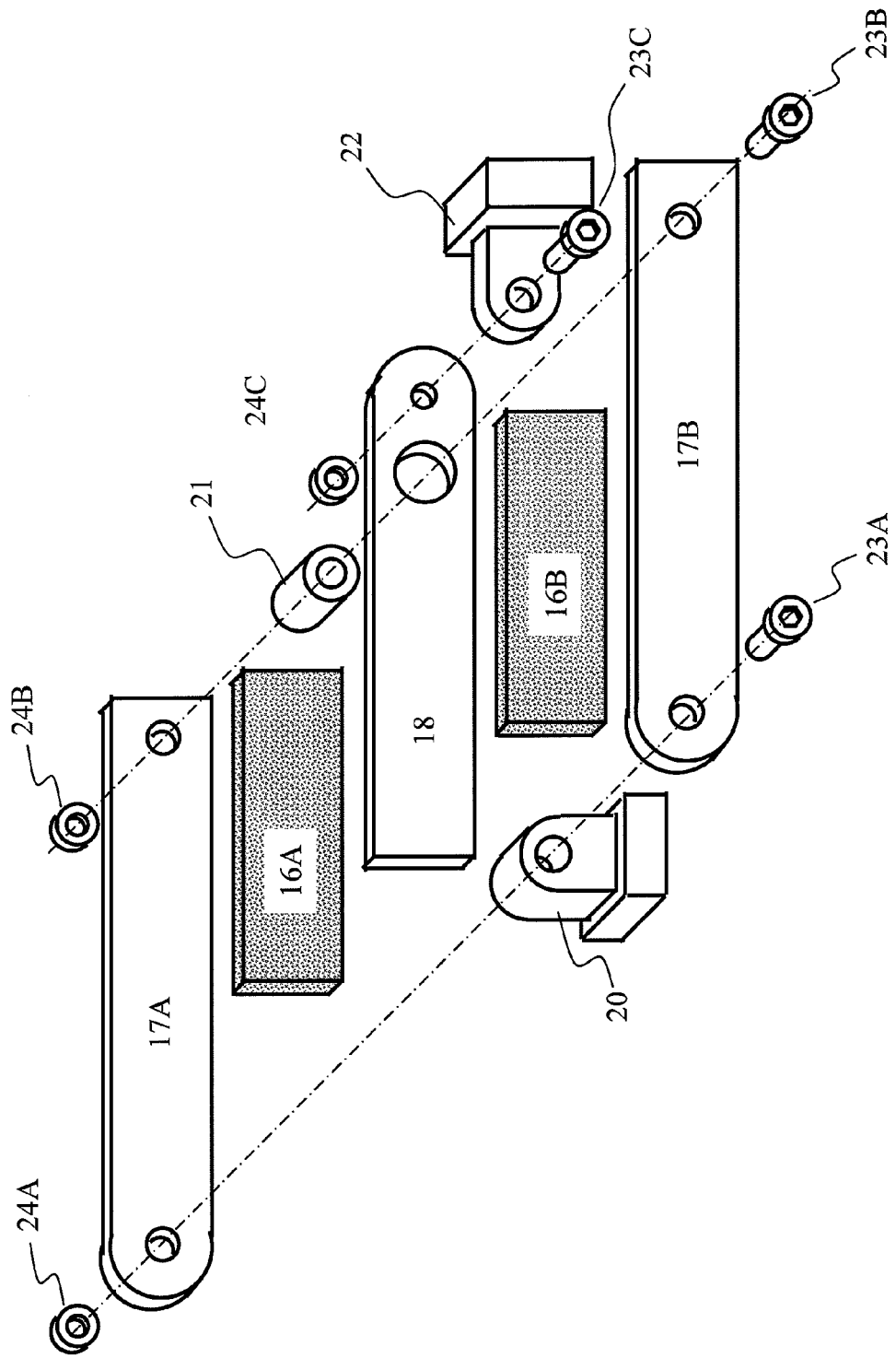
FIG. 9 is an exploded view illustrating a structure of a vibration damping member 19.

FIG. 9 is an exploded view illustrating a structure of a vibration damping member 19. It should be noted that although a structure of a vibration damping member 19 that has been described in embodiments 1 and 2 is illustrated here, the vibration damping members 19 described in embodiment 3 each have a configuration similar thereto except the number of members at attachment parts.

Viscoelastic material sheets 16A and 16B are sandwiched and held by a minimum number of metal support plates 17A, 17B and 18. The viscoelastic material sheets 16A and 16B are adhered to, or affixed via double-faced tapes to, the metal support plates 17A, 17B and 18.

As a result of the movable-side metal support plate 18 moving in its plane relative to the stationary-side metal support plates 17A and 17B, the viscoelastic material sheets 16A and 16B have shear deformation.

Since it is desirable that the space between the stationary-side metal support plates 17A and 17B be constantly fixed, and thus, a stationary-side spacer block 20 and a movable-side spacer 21 are inserted between the stationary-side metal support plates 17A and 17B, and the stationary-side metal support plates 17A and 17B are then fastened to each other via bolts 23A and 23B, and nuts 24A and 24B. Consequently, the space between the movable-side metal support plate 18 and the stationary-side metal support plate 17 is also maintained fixed. Furthermore, an effect of preventing misalignment of the viscoelastic material sheets 16 when adhering the viscoelastic material sheets 16, and an effect of preventing separation of the adhesion parts of the viscoelastic material sheets 16 when securing the vibration damping member 19 to a sample chamber 11 or a charged particle optical lens barrel 1 are provided. Also, the movable-side metal support plate 18 includes openings to avoid interference of the respective spacers.

The stationary-side spacer block 20 is attached to an upper surface of the sample chamber 11. The movable-side metal support plate 18 is connected to a movable-side block 22 via a bolt 23C and a nut 24C. The movable-side block 22 is attached to the charged particle optical lens barrel 1. The respective blocks and the sample chamber 11 or the charged particle optical lens barrel 1 are fastened via bolts (illustration omitted).

As described above, according to the present embodiment 4, spaces for maintaining the spaces between the respective support plates fixed are inserted between the metal support plates, enabling exertion of stable vibration damping performance. Furthermore, as a result of the spaces between the respective metal support plates being maintained fixed, an effect of preventing displacement and/or separation of the viscoelastic material sheets 16 can be expected.

Embodiment 5

Although embodiments 1 to 4 above has been described in terms of a configuration in which two viscoelastic material sheets 16A and 16B are sandwiched by three metal support plates 17A, 17B and 18, these counts are not necessarily limited to the aforementioned ones. For example, counts of viscoelastic material sheets 16 and metal support plates and a manner that the viscoelastic material sheets 16 are sandwiched by the metal support plates can arbitrarily be determined as long as shear strain is generated in the viscoelastic material sheets 16 resulting from inclination and/or vibration of the charged particle optical lens barrel 1.

For example, it is possible that one viscoelastic material sheet 16 is sandwiched by one stationary-side metal support plate 17 and one movable-side metal support plate 18, the stationary-side metal support plate 17 is secured to an upper surface of a sample chamber 11, and the movable-side metal support plate 18 is secured to a side surface of the charged particle optical lens barrel 1.

Reference Embodiment

The present embodiment is a reference embodiment in which a configuration of a vibration damping member 19 has been changed for comparison with the vibration damping member(s) 19 in embodiments 1 to 5.

Figure 10:
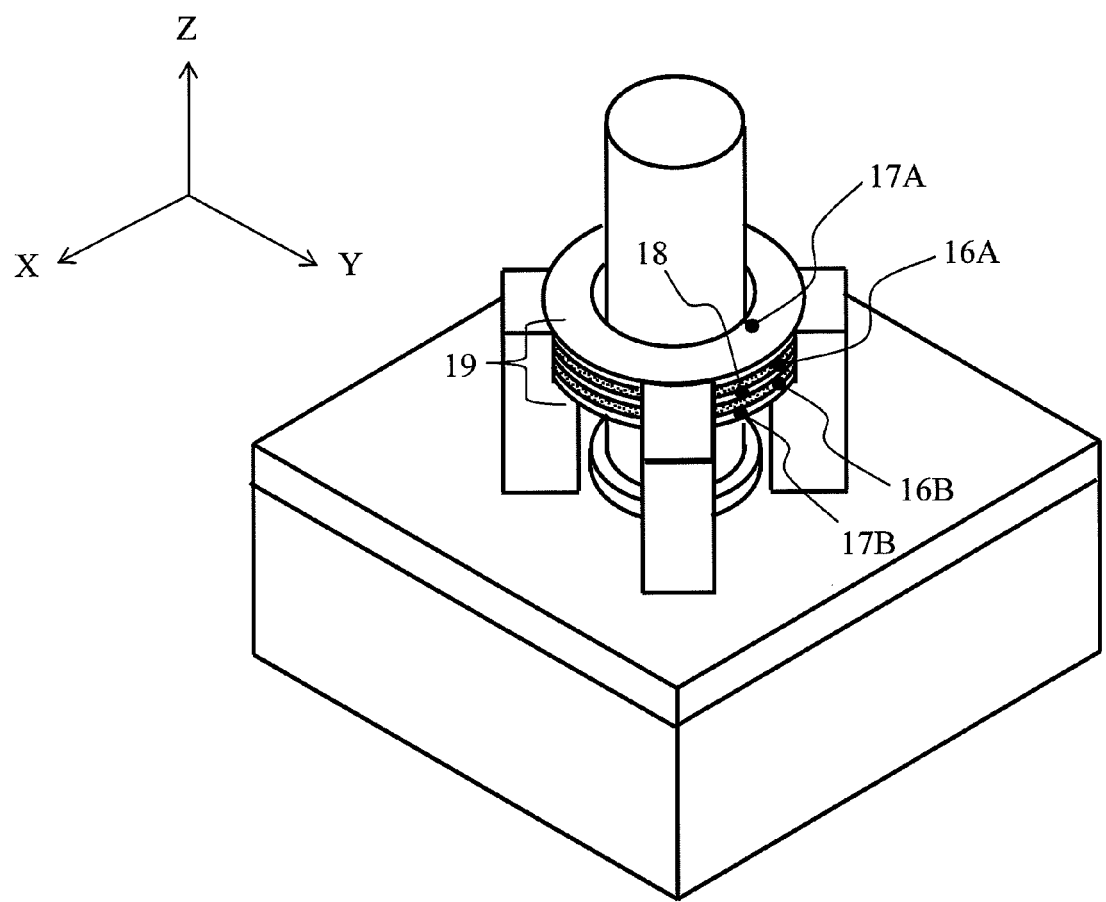
FIG. 10 is a diagram of a configuration around a charged particle optical lens barrel 1 of a charged particle radiation device 100 according to a reference embodiment.

FIG. 10 is a diagram of a configuration around a charged particle optical lens barrel 1 of a charged particle radiation device 100 according to the present reference embodiment. In FIG. 10, a vibration damping member 19 is formed in a circular shape so as to surround a side surface of the charged particle optical lens barrel 1.

As in embodiments 1 to 5, stationary-side metal support plates 17A and 17B are secured to an upper surface of a sample chamber 11 via struts. A movable-side metal support plate 18 is disposed between the stationary-side metal support plates 17A and 17B, and secured to a side surface of the charged particle optical lens barrel 1.

Also, as in embodiments 1 to 5, the stationary-side metal support plate 17A and the movable-side metal support plate 18 sandwich a viscoelastic material sheet 16A, and the stationary-side metal support plate 17B and the movable-side metal support plate 18 sandwich a viscoelastic material sheet 16B.

The present reference embodiment is different from embodiments 1 to 5 in that a normal to a sheet surface of each viscoelastic sheet 16 is parallel to a longitudinal direction of the charged particle optical lens barrel 1 (or a center axis of the charged particle optical lens barrel 1). In other words, a plane including a sheet surface of each viscoelastic material sheet 16 is perpendicular to the center axis of the charged particle optical lens barrel 1.

Where the charged particle optical lens barrel 1 has a small inclination, a gravity center of the charged particle optical lens barrel 1 can be regarded as moving within a plane of the upper surface of the sample chamber 11, and thus, shear strain is generated in the viscoelastic material sheets 16, enabling exertion of vibration damping performance. Meanwhile, where the charged particle optical lens barrel 1 vibrates vertically, a force is imposed mainly in a thickness direction of the viscoelastic material sheets 16, and thus, no substantial shear strain can be considered to occur.

As described above, in the configuration illustrated in FIG. 10, the vibration damping performance for vertical vibration of the charged particle optical lens barrel 1 can be considered as being low compared to embodiments 1 to 5. Furthermore, struts for supporting the vibration damping member 19 are required, and thus, as the struts are higher, the horizontal rigidity is decreased, and accompanied by the decrease, the vibration damping performance is also lowered.

Meanwhile, in the configurations according to embodiments 1 to 5, displacement resulting from movement of the movable-side metal support plate 18 directly contributes to shear strain in the viscoelastic material sheets 16, enabling exertion of sufficient vibration damping performance.

Embodiment 6

In embodiment 6, an expression for defining the vibration damping performance of a vibration damping member 19 is derived, and a numerical value of vibration damping performance is calculated by assigning specific parameters.

Figure 11:
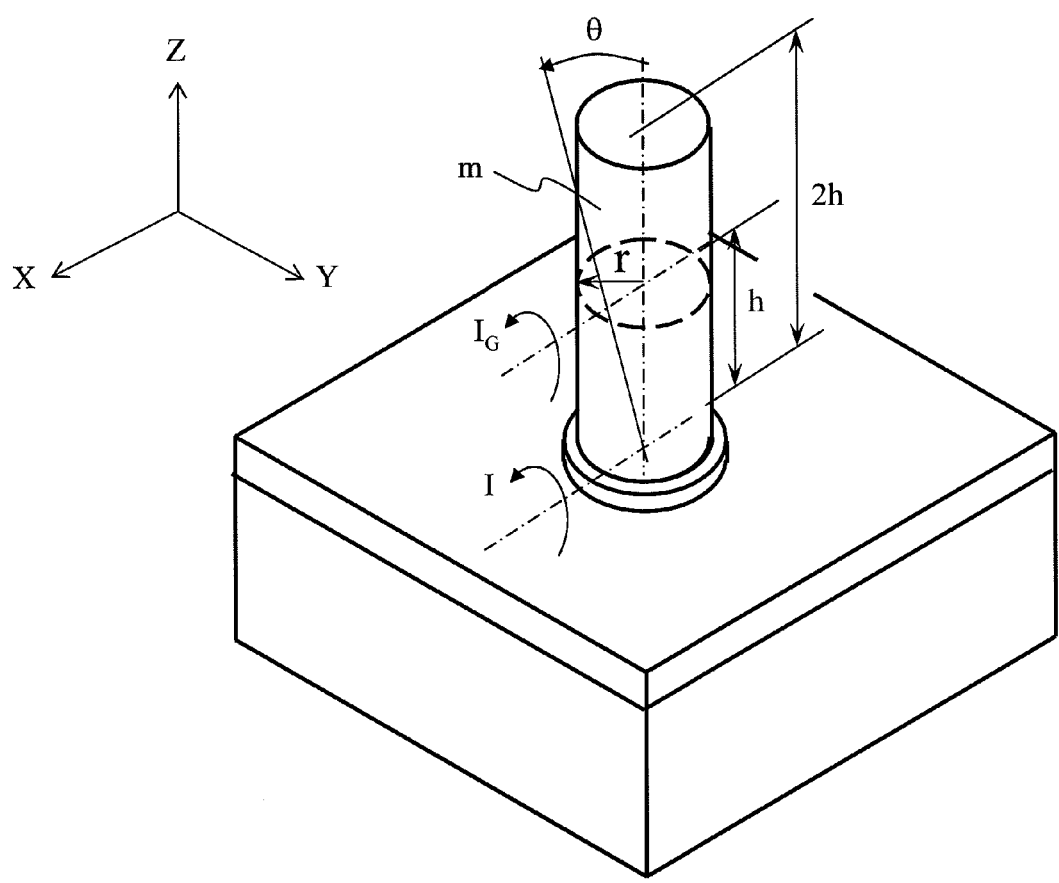
FIG. 11 is a diagram in which a charged particle optical lens barrel 1 and a configuration therearound are schematized.

FIG. 11 is a diagram in which a charged particle optical lens barrel 1 and a configuration therearound are schematized. Here, for simplification, it is assumed that the charged particle optical lens barrel 1 is a cylindrical inverted pendulum as illustrated in FIG. 11. A total length of the charged particle optical lens barrel 1 is 2 h, a height to a gravity center of the charged particle optical lens barrel 1 is h, a mass of the charged particle optical lens barrel 1 is m, and a radius of a lens barrel of the charged particle optical lens barrel 1 is r. An equation for moment balancing can be expressed below (Expression 1).

[Expression 1]

$$I\cdot\ddot{\theta}+C\cdot\dot{\theta}+K\cdot\theta-m\cdot g\cdot h\cdot\sin\theta=0 \quad \text{(Expression 1)}$$

where,
θ is an angle of inclination of the lens barrel (sin θ≈0 in the case of a very small angle);
I is a moment of inertia of the leans barrel;
C is a damping coefficient in a direction of inclination of an attachment part of the lens barrel; and
K is a spring constant in a direction of inclination of the attachment part of the lens barrel.

(Expression 1) above can be changed to (Expression 2) below.

[Expression 2]

$$\ddot{\theta}+\frac{C}{I}\cdot\dot{\theta}+\frac{(K-m\cdot g\cdot h)}{I}\cdot\theta=0 \quad \text{(Expression 2)}$$

(Expression 2) can be changed to (Expression 3) below using a damping ratio ζ and a natural angular vibration frequency $\omega_n$.

[Expression 3]

$$\ddot{\theta}+2\cdot\zeta\omega_n\cdot\dot{\theta}+\omega_n^2\cdot\theta=0 \quad \text{(Expression 3)}$$

Since the relationship between the damping ratio ζ and a loss coefficient η can be expressed by η=2ζ, (Expression 3) can be indicated by (Expression 4) below.

[Expression 4]

$$\ddot{\theta}+\eta\cdot\omega_n\cdot\dot{\theta}+\omega_n^2\cdot\theta=0 \quad \text{(Expression 4)}$$

There is a limit to an increase in natural angular vibration frequency ω and attachment rigidity (K) of the lens barrel. Meanwhile, loss coefficients 11 of metal materials range from 0.0001 to 0.001 while loss coefficients 11 of viscoelastic materials range from 0.01 to 1.0.

In the present embodiment, one side of a planar layered structure (vibration damping member 19) including viscoelastic material sheets 16 sandwiched by metal support plates is attached to a sample chamber 11 and another side thereof is attached to the charged particle optical lens barrel 1 so as to achieve an angular disposition in which the planar layered structure is parallel to a center axis of the charged particle optical lens barrel 1.

Next, a vibration absorption effect of a viscoelastic material sheet 16 when the lens barrel vibrates will be considered. Where a maximum inclination angle of the charged particle optical lens barrel 1 is $\theta_0$, an inclination angle θ can be expressed by (Expression 5) below using a trigonometric function.

[Expression 5]

$$\theta=\theta_0\cdot\sin(\omega_n\cdot t) \quad \text{(Expression 5)}$$

An inclination angular velocity can be expressed by (Expression 6) below.

[Expression 6]

$$\dot{\theta}=\theta_0\cdot\omega_n\cdot\cos(\omega_n\cdot t) \quad \text{(Expression 5)}$$

A maximum kinetic energy $E_1$ when the charged particle optical lens barrel 1 is vibrating can be expressed by (Expression 7) below.

[Expression 7]

$$E_1=1/2\cdot I\cdot\dot{\theta}^2=1/2\cdot I\cdot(\omega_n\cdot\theta_0)^2 \quad \text{(Expression 7)}$$

Here, the moment of inertia of the circular cylinder when a rotational axis is present at an attachment part of the charged particle optical lens barrel 1 is indicated by (Expression 8) below. A first term (m·h²) in (Expression 8) is a moment of inertia of the mass m away from the rotational axis by h, a second term ($I_G$) is a moment of inertia of the circular cylindrical shape when the rotational axis is present at a center position thereof.

[Expression 8]

$$\begin{aligned}I &= m\cdot h^2 + I_G \\ &= m\cdot h^2 + m\cdot\frac{3\cdot r^2+(2\cdot h)^2}{12} \\ &= m\cdot\left(\frac{1}{4}\cdot r^2+\frac{4}{3}\cdot h^2\right) \\ &= m\cdot\left(\frac{1}{4}\cdot r^2+\frac{4}{3}\cdot h^2\right)\end{aligned} \quad \text{(Expression 8)}$$

Figure 12:
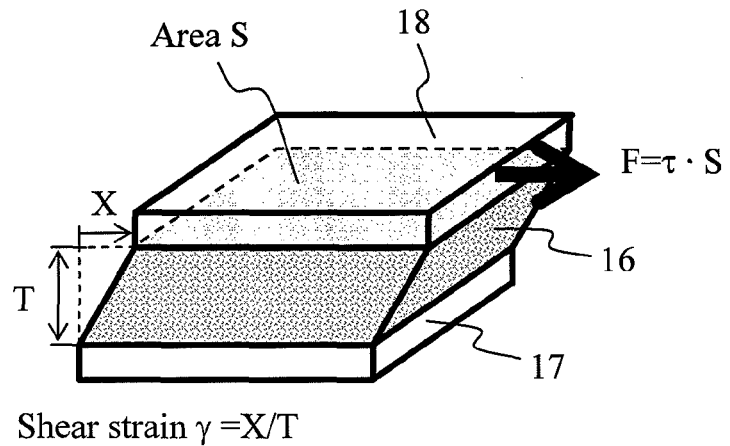
FIG. 12 is a diagram illustrating a manner in which a viscoelastic material sheet 16 is sandwiched by two metal support plates 17 and 18.

FIG. 12 is a diagram illustrating a state in which a viscoelastic material sheet 16 is sandwiched by two metal support plates 17 and 18. The Figure indicates a relationship between shear strain γ and displacement X and a relationship between shear stress τ and shear force F. Shear strain γ when the viscoelastic material sheet 16 has a shear deformation corresponds to a ratio of displacement X to a thickness T of the viscoelastic material sheet 16(=X/T).

Where a maximum displacement is $X_0$ and maximum shear strain $\gamma_{max}$, the maximum max displacement $X_0$ is expressed by (Expression 9) below.

[Expression 9]

$$X_0=\gamma_{max}\cdot T \quad \text{(Expression 9)}$$

Assigning (Expression 8) to (Expression 7), and since approximation of tan $\theta_0\approx\theta_0$ can be provided where $\theta_0$ is very small, the maximum kinetic energy can be expressed by (Expression 10) below using $\gamma_{max}$ and T.

[Expression 10]

$$E_1=\frac{1}{2}\cdot m\cdot\left(\frac{1}{4}\cdot r^2+\frac{4}{3}\cdot h^2\right)\cdot\left(\omega_n\cdot\frac{\gamma\max\cdot T}{h}\right)^2 \quad \text{(Expression 10)}$$

Hereinafter, it is assumed that a storage elastic modulus of a viscoelastic material sheet 16 is G', a loss coefficient of the storage elastic modulus is η, and the adhesion area of the viscoelastic material sheet 16 is S.

Figure 13:
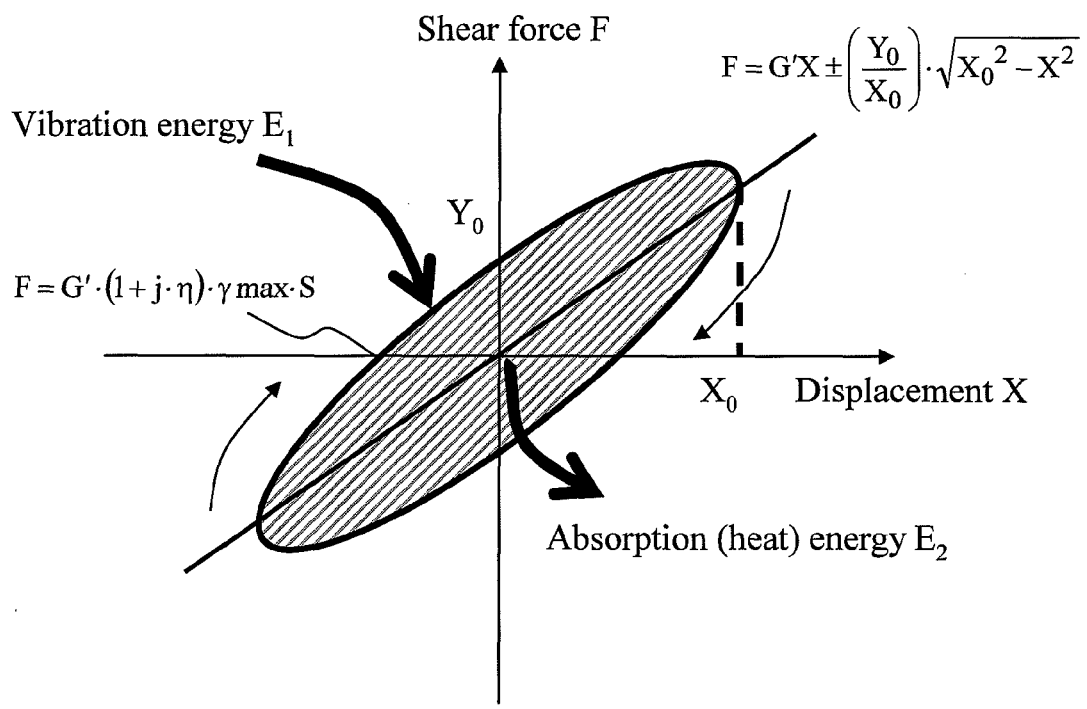
FIG. 13 is a diagram illustrating a relationship between displacement X and shear force F of a viscoelastic material sheet 16.

FIG. 13 is a diagram illustrating a relationship between displacement X and shear force F in a viscoelastic material sheet 16. Energy that can be absorbed when one viscoelastic material sheet 16 is subjected to forcible displacement $X_0$ is indicated by a shaded part in FIG. 13. A Y-intercept of the curve in FIG. 13 is expressed by (Expression 12) based on the coefficient in the imaginary part in (Expression 11) below.

[Expression 11]

$$F=G'\cdot(1+j\cdot\eta)\cdot\gamma\max\cdot S (j=\text{imaginary unit}) \quad \text{(Expression 11)}$$

[Expression 12]

$$Y_0=G'\cdot\eta\cdot\gamma\max\cdot S \quad \text{(Expression 12)}$$

Accordingly, energy $E_2$ that can be absorbed by the viscoelastic material sheet 16 is expressed by (Expression 13) below.

[Expression 13]

$$E_2 = \int_{-X_0}^{X_0} \left\{ \left( G' \cdot X + \left( \frac{Y_0}{X_0} \right) \cdot \sqrt{X_0^2 - X^2} \right) - \left( G' \cdot X - \left( \frac{Y_0}{X_0} \right) \cdot \sqrt{X_0^2 - X^2} \right) \right\} dX$$

$$= 2 \cdot \left( \frac{Y_0}{X_0} \right) \cdot \int_{-X_0}^{X_0} \sqrt{X_0^2 - X^2} \, dX$$

$$= 2 \cdot \left( \frac{Y_0}{X_0} \right) \cdot \left( \frac{1}{2} \cdot \pi \cdot X_0^2 \right)$$

$$= \pi \cdot X_0 \cdot Y_0$$

$$= \pi \cdot (\gamma \max \cdot T) \cdot (G' \cdot \eta \cdot \gamma \max \cdot S)$$

(Expression 13)

Where a vibration energy absorption efficiency when n viscoelastic material sheets 16 are provided is $E_2/E_1$, the absorption efficiency $E_2/E_1$ is expressed by (Expression 14) below.

[Expression 14]

$$\frac{E_2}{E_1} = \frac{\pi \cdot G' \cdot \eta \cdot S \cdot \gamma\max^2 \cdot T \cdot n}{\frac{1}{2} \cdot m \cdot \left( \frac{1}{4} \cdot r^2 + \frac{4}{3} \cdot h^2 \right) \cdot \left( \omega_n \cdot \frac{\gamma\max \cdot T}{h} \right)^2}$$

$$= \frac{2 \cdot \pi \cdot G' \cdot \eta \cdot S \cdot n}{m \cdot \left\{ \frac{1}{4} \cdot \left( \frac{r}{h} \right)^2 + \frac{4}{3} \right\} \cdot \omega_n^2 \cdot T}$$

(Expression 14)

Since (Expression 14) does not include $\gamma_{max}$, it can be understood that the absorption max efficiency does not depend on the magnitude of the shear strain. Accordingly, in order to increase the absorption efficiency, it is possible to increase a loss characteristic (G'·η) of the viscoelastic material, and the adhesion area (S), increase the number (n) of viscoelastic material sheets 16 and decrease the thickness (T) of the viscoelastic material sheets 16.

Figure 14:
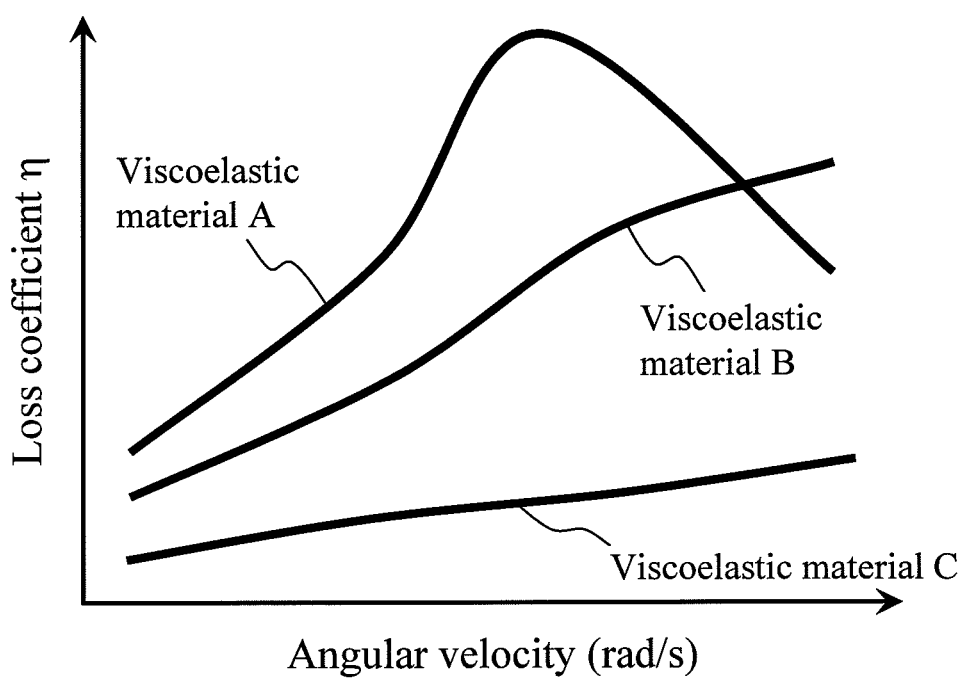
FIG. 14 is a diagram illustrating loss coefficients 11 of viscoelastic material sheets 16.

FIG. 14 is a diagram illustrating loss coefficients 11 of viscoelastic material sheets 16. As illustrated in FIG. 14, the loss coefficients 11 have angular-velocity dependency, i.e., vary depending on the material, and thus, it is necessary to select a material so as to obtain a high loss coefficient for a frequency range to be subjected to vibration damping.

As described above, vibration damping performance of a viscoelastic material sheet 16 can be figured out quantitatively. Accordingly, a vibration damping member 19 configured and disposed optimally for exerting desired vibration damping performance, not simply including viscoelastic material sheets 16 as a countermeasure for vibration characteristics of a charged particle optical lens barrel 1, can be designed based on the results of consideration in the present embodiment.

Embodiment 7

As an embodiment, assigning the following parameters to (Expression 14), energy absorbed by a vibration absorber is twelve times vibration energy of a charged particle optical lens barrel 1, and thus, it can be understood that a sufficient effect can be expected for reduction in vibration amplitude and damping time.

(1) Mass: m=100 (kg)
(2) Storage elastic modulus: G'=450×10³ (Pa)
(3) Loss coefficient: η=0.7
(4) Area of each viscoelastic material sheet: S=0.01 (m³)
(5) Number of viscoelastic material sheets: n=2×2 (2 sets of 2 sheets)
(6) Thickness of each viscoelastic material sheet: T=0.0005 (m)
(7) Radius of the charged particle optical lens barrel: r=0.1 (m)
(8) Height of the charged particle optical lens barrel: 2 h=0.6 (m)
(9) Natural angular vibration frequency: $\omega_n$=320 (rad/s)

Embodiment 8

As the present embodiment, an embodiment of a charged particle radiation device in which ion pumps are attached to the charged particle radiation device described in embodiment 1 will be described.

In the charged particle radiation device, a charged particle gun is attached to a charged particle optical lens barrel, and thus, it is necessary to maintain a high vacuum state compared to that of the vacuum sample chamber. Accordingly, it is common to perform evacuation using sub-pumps in addition to a main pump for a vacuum sample chamber, and in general, ion pumps are used.

However, when a stage held in the sample chamber is moved, a reaction force generated during driving and/or during halting is imposed on the sample chamber, causing natural vibration of ion pumps supported on the charged particle optical lens barrel. Also, there is almost no damping factors between the ion pumps and the charged particle optical lens barrel because the ion pumps and the charged particle optical lens barrel are generally fastened to each other via a flange, causing a problem of taking a long time for vibration damping.

Because of the aforementioned natural vibration of the ion pumps, the charged particle optical lens barrel vibrates, resulting in deterioration in image quality of an observed image and resolution of the charged particle radiation device. It is possible to wait until vibration is damped; however, as described above, it takes a lot of time to damp vibration, resulting in an increase in time of taking images.

Figure 15:
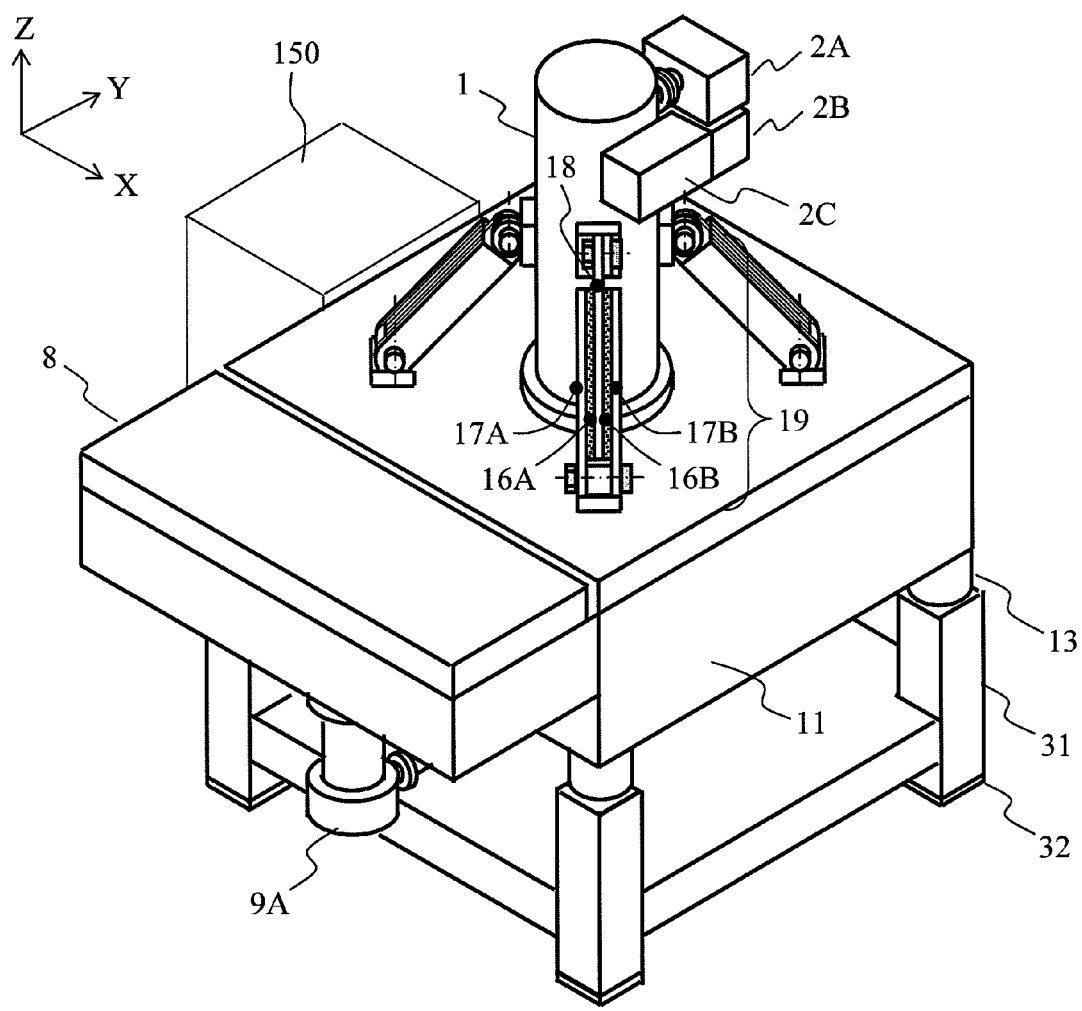
FIG. 15 is a perspective diagram illustrating an overall configuration of a charged particle radiation device according to embodiment 8.

FIG. 15 is a perspective diagram illustrating an overall configuration of a charged particle radiation device. Description of components that are the same as those described in embodiments 1 to 7 will be omitted.

In order to absorb a floor flatness of around several millimeters, a rubber pad 32 is adhered to a bottom part of a leg of each mount 31. A vibration-free mount 13 is provided between each mount 31 and the sample chamber 11, whereby floor vibration in a frequency range higher than a natural vibration frequency of the vibration-free mounts 13 is damped. A load lock chamber 8 is secured to a sample chamber 11, and after a wafer is loaded under an atmospheric condition, the load lock chamber 8 is evacuated by a turbo-molecular pump 9A. When the load lock chamber has been evacuated, the wafer is mounted on a stage inside the sample chamber, thereby achieving a state in which a sample placed inside a sample chamber 11 can be irradiated or scanned with a charged particle radiation beam.

Although a method for connection between the charged particle optical lens barrel 1 and the sample chamber 11 is the same as that described with reference to FIG. 5, ion pumps 2A, 2B and 2C are attached to an upper portion of the charged particle optical lens barrel 1, whereby the space at the position of the charged particle gun 3 is maintained in an ultrahigh vacuum state. An overall control unit 150 executes sequences for controlling the overall configuration including the charged particle optical lens barrel, the sample chamber and load lock chamber as described above.

When the overall control unit 150 executes a sequence for inspection of defects of semiconductor devices, review of defects or measurement of dimensions of a pattern, high-speed movement, halting and observation of the stage are repeated. Upon a reaction force to driving of the stage being imposed on the sample chamber, the sample chamber shakes, causing natural vibration of the charged particle optical lens barrel 1. In such a situation, the charged particle optical lens barrel shakes relative to the sample chamber. By an effect of vibration damping members 19, the natural vibration of the charged particle optical lens barrel 1 is promptly damped and the vibration amplitude is reduced.

Figure 16:
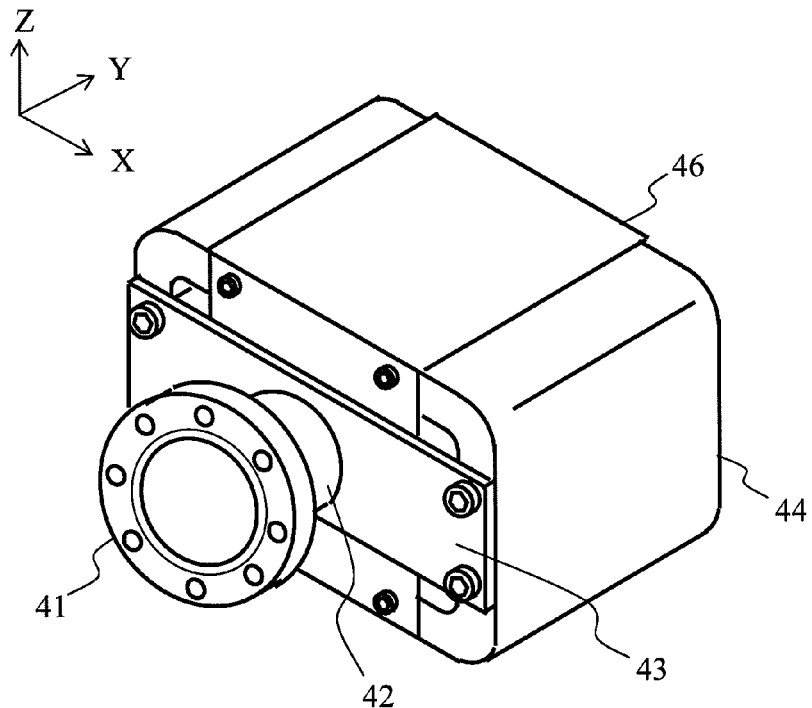
FIG. 16 is a perspective diagram of an outer appearance of an ion pump.

FIG. 16 is a perspective diagram of an outer appearance of an ion pump 2A, 2B or 2C. The ion pump is a vacuum pump that causes discharge between anodes and titanium cathodes to ionize titanium on surfaces of the cathodes, and provide a discharge effect by gettering performed by titanium ions.

A flange 41 is welded to a pipe 42, and the pipe 42 is welded to a chamber 43. Strong permanent magnets 45A and 45A are secured to the yoke 44, and the exposed surfaces of the permanent magnets are covered by a cover 46. A chamber 43 and the yoke 44 are fastened to each other via bolts. In the present embodiment, the entirety of the components included in the yoke 44 and the cover 46 is referred to as "ion pump".

Figure 17:
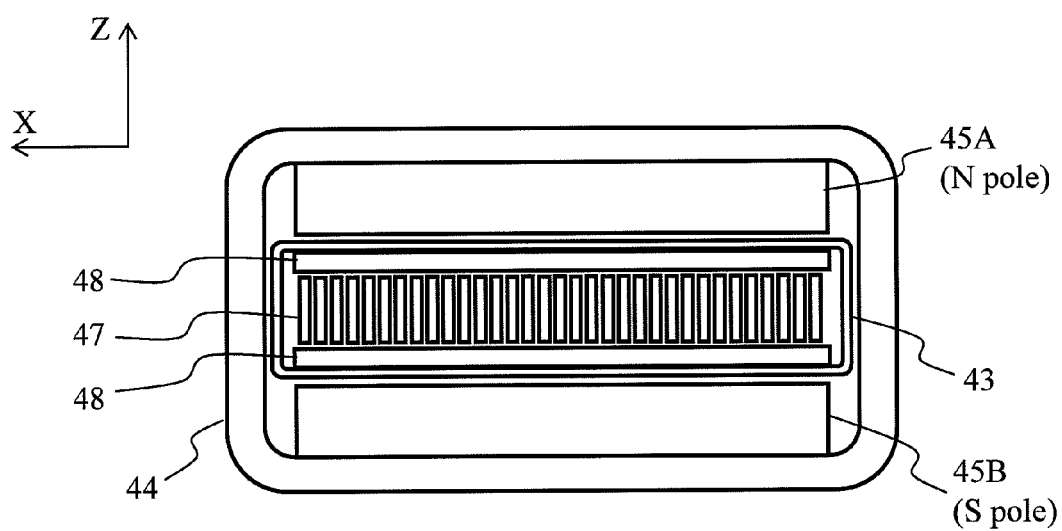
FIG. 17 is a cross-sectional diagram illustrating an inner structure of the ion pump.
Figure 18:
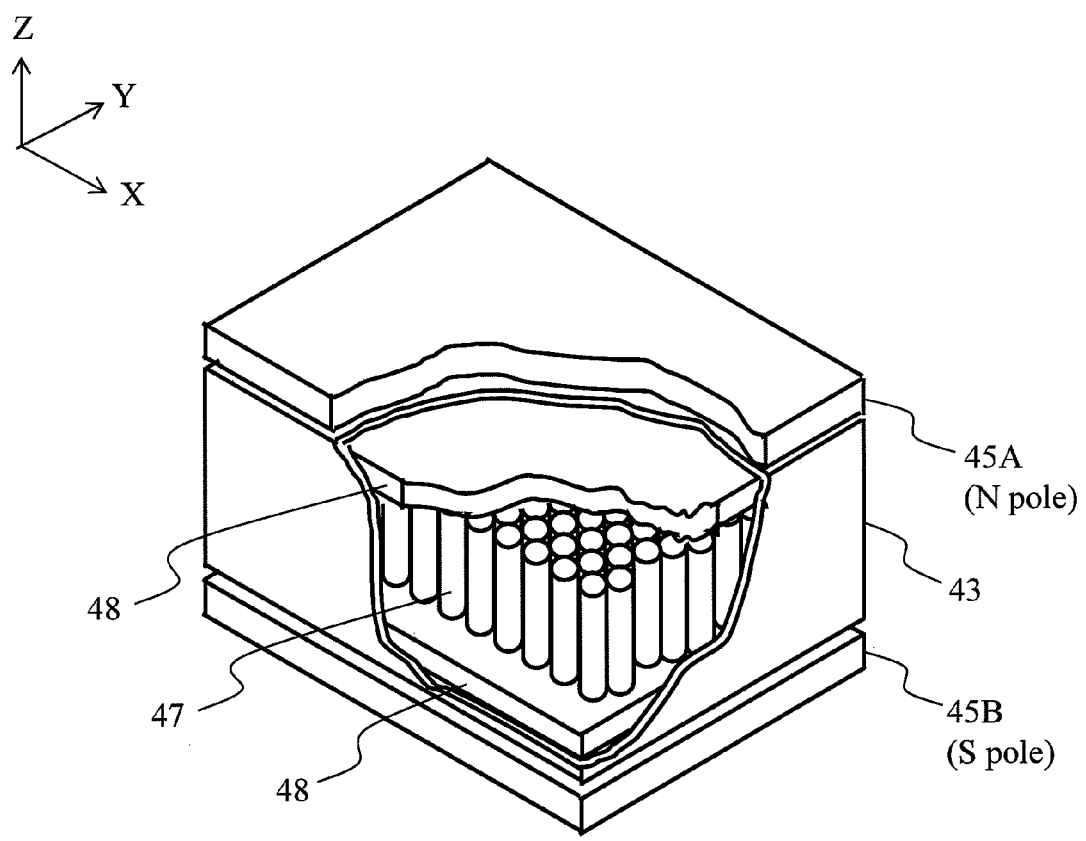
FIG. 18 is a diagram of an inner structure of a chamber provided inside the ion pump.

A cross-section of the ion pump is illustrated in FIG. 17, and an inner structure of the chamber 43 is illustrated in FIG. 18. N-pole and S-pole permanent magnets 45A and 45A are secured to the yoke 44, forming a strong and uniform magnetic field on the chamber 43. Inside the chamber 43, titanium cathodes 48 (negative electrode) are disposed above and below anodes 47 (positive electrode). A high positive voltage is applied to the anodes 47 compared to the cathodes 48. Thus, discharge occurs between the anodes and the cathodes, and gas molecules collide with electrons, forming ions, and the ions collide with the titanium cathodes, beating titanium atoms out of the cathode surfaces. The titanium atoms are chemically active, and chemically absorbs, e.g., hydrogen, oxygen, nitrogen and carbon monoxide, whereby the vacuum of the inside of the chamber is improved.

As described above, even with the vibration damping members according to embodiment 1, inclination and vibration of a charged particle radiation optical lens barrel resulting from movement of a stage can be suppressed.

Figure 19:
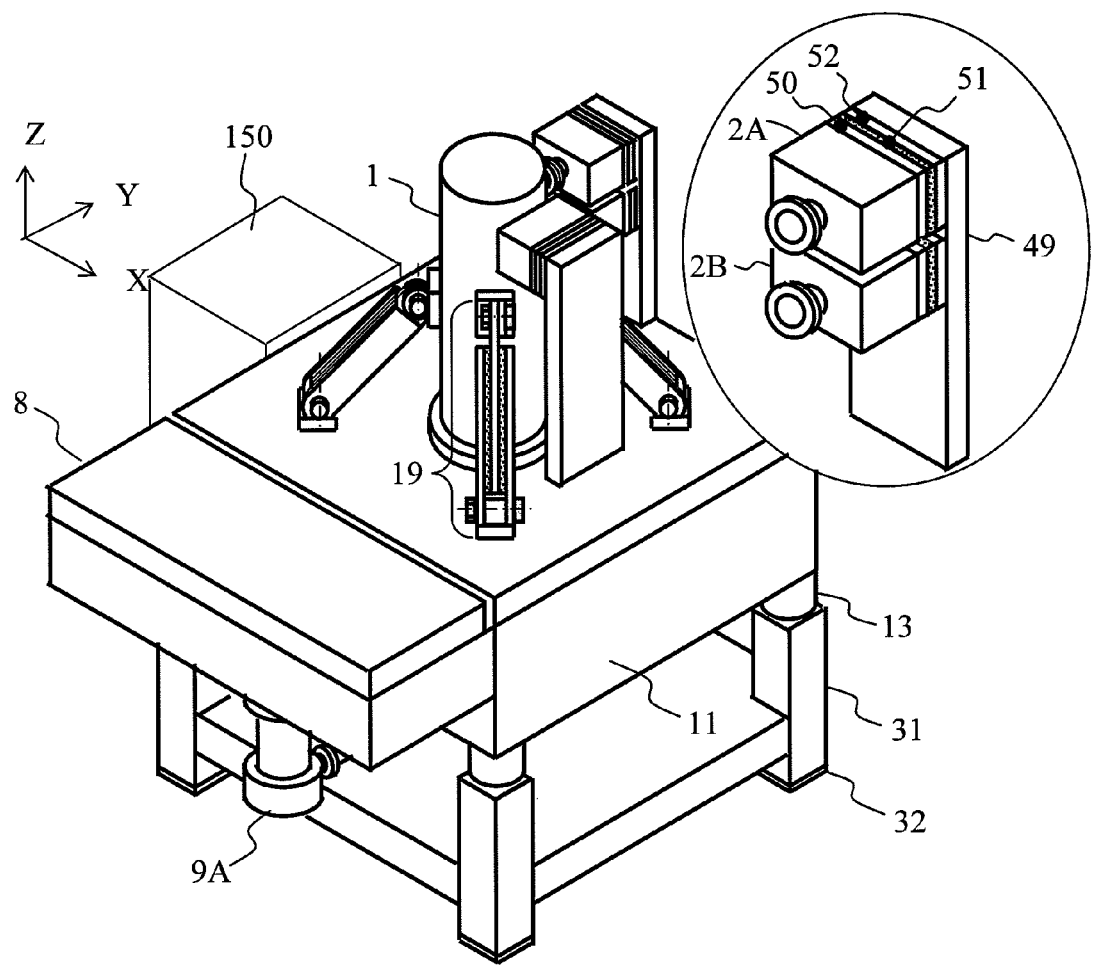
FIG. 19 is a perspective diagram illustrating an overall configuration of a charged particle radiation device according to embodiment 9.

FIG. 19 illustrates an embodiment in which vibration damping members for ion pumps 2A, 2B and 2C are provided in addition to vibration damping members 19 for a charged particle optical lens barrel.

As described above, depending on the magnitude of a force for driving the stage, not only natural vibration of the charged particle optical lens barrel 1, but also natural vibration of the ion pumps 2A, 2B and 2C may occur. Although a natural vibration mode of an ion pump depends on the thickness and weight of the yoke, the pipe and the chamber, results of evaluation of a vibration mode of an actual ion pump indicates that the vibration mode is a vibration mode that the ion pump rotates in θx, θy and θz directions with a position secured via a flange as a center.

A method for damping vibration of an ion pump will be described below. An ion pump support frame 49 is secured to a sample chamber 11 via bolts. A vibration damping member formed by adhering a support plate to each of opposite surfaces of a viscoelastic material sheet 51 is fabricated. One ion pump movable-side support plate 50 in the vibration damping member is fastened to a chamber of an ion pump via bolts and the other ion pump stationary-side support plate 52 is fastened to the ion pump support frame 49 via bolts. Consequently, a structure in which the vibration damping member secured to the sample chamber is attached to a back surface (side opposite to the surface fastened to the flange) of the ion pump is formed. Consequently, during the entire ion pump vibrating at a natural vibration frequency, shear strain is imposed on the viscoelastic material sheet 51, and thus, a damping effect is exerted.

As described above, use of first vibration damping members for a charged particle optical lens barrel and second vibration damping members for ion pumps in a charged particle radiation device as in the present embodiment enable provision of a charged particle radiation device having a vibration damping capability for not only vibration of the charged particle optical lens barrel accompanied by movement of a stage, but also vibration in a range including a natural vibration mode of the ion pumps. This means that a sample stage requiring a larger driving force and a braking force can be mounted, and thus, an enhanced throughput of charged particle radiation devices can be achieved.

REFERENCE SIGNS LIST

1: charged particle optical lens barrel, 2: ion pump, 3: charged particle radiation source, 4: charged particle radiation beam, 5: objective lens, 6: sample, 7: deflector, 8: load lock chamber, 9A, 9B: turbomolecular pump, 10A, 10B: dry pump, 11: sample chamber, 12: stage, 13: vibration-free mount, 14: X-table, 15: Y-table, 16, 16A, 16B: viscoelastic material sheet, 17, 17A, 17B: stationary-side metal support plate, 18: movable-side metal support plate, 19: vibration damping member, 20: stationary-side spacer block, 21: spacer, 22: movable-side block, 23A, 23B, 23C: bolt, 24A, 24B, 24C: nut, 43: chamber, 44: yoke, 45A, 45B: permanent magnet, 47: anode, 48: cathode, 49: ion pump support frame, 50: ion pump movable-side support plate, 51: viscoelastic material sheet, 52: ion pump stationary-side support plate.

The invention claimed is:

1. A charged particle radiation device comprising:
a sample chamber configured to have a sample in an inside thereof;
a charged particle optical lens barrel including a charged particle optical system configured to irradiate the sample with a charged particle radiation beam; and
a vibration damping member including an end secured to an upper surface of the sample chamber and another end secured to the charged particle optical lens barrel,
wherein the vibration damping member includes a viscoelastic sheet, and a plurality of support plates holding the viscoelastic sheet;
wherein the vibration damping member is disposed so that a sheet surface of the viscoelastic sheet is not perpendicular to a center axis of the charged particle optical lens barrel and so that a normal to a cylindrical surface of the charged particle optical lens barrel at a position to which the vibration damping member is attached and a normal to a sheet surface of the viscoelastic sheet are at least not parallel to each other, and
wherein the vibration damping member is disposed so that a sheet surface of the viscoelastic sheet is vertical to an upper surface of the sample chamber.

2. A charged particle radiation device comprising:
a sample chamber configured to have a sample in an inside thereof;
a charged particle optical lens barrel including a charged particle optical system configured to irradiate the sample with a charged particle radiation beam; and
a vibration damping member including an end secured to an upper surface of the sample chamber and another end secured to the charged particle optical lens barrel,
wherein the vibration damping member includes a viscoelastic sheet, and a plurality of support plates holding the viscoelastic sheet;
wherein the vibration damping member is disposed so that a sheet surface of the viscoelastic sheet is not perpendicular to a center axis of the charged particle optical lens barrel and so that a sheet surface of the viscoelastic sheet does not face a cylindrical surface of the charged particle optical lens barrel; and
wherein the vibration damping member is disposed so that a sheet surface of the viscoelastic sheet is vertical to an upper surface of the sample chamber.

3. The charged particle radiation device according to claim 1, wherein the vibration damping member is disposed so that the vibration damping member is inclined relative to a longitudinal direction of the charged particle optical lens barrel.

4. The charged particle radiation device according to claim 1,
wherein the vibration damping member has a rectangular shape; and
wherein the vibration damping member is disposed so that a first side of the rectangular shape is secured to the charged particle optical lens barrel and a second side of the rectangular shape is secured to the sample chamber.

5. The charged particle radiation device according to claim 1,
wherein the vibration damping member includes:
a first support plate secured on the charged particle optical lens barrel side;
a second support plate secured on the sample chamber side; and
a viscoelastic sheet adhered to the first support plate and the second support plate.

6. The charged particle radiation device according to claim 5, wherein the vibration damping member includes a spacer that maintains a space between the first support plate and the second support plate fixed.

* * * * *